(12) United States Patent
Nakano

(10) Patent No.: US 12,721,209 B2
(45) Date of Patent: Aug. 25, 2026

(54) SEMICONDUCTOR DEVICE

(71) Applicant: ROHM CO., LTD., Kyoto (JP)

(72) Inventor: Yuki Nakano, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 674 days.

(21) Appl. No.: 17/918,122

(22) PCT Filed: Apr. 30, 2021

(86) PCT No.: PCT/JP2021/017225
§ 371 (c)(1),
(2) Date: Oct. 11, 2022

(87) PCT Pub. No.: WO2021/225120
PCT Pub. Date: Nov. 11, 2021

(65) Prior Publication Data

US 2023/0136019 A1 May 4, 2023

(30) Foreign Application Priority Data

May 8, 2020 (JP) ................................ 2020-082728

(51) Int. Cl.
*H10W 72/90* (2026.01)
*H10W 74/01* (2026.01)
(Continued)

(52) U.S. Cl.
CPC ........... *H10W 72/90* (2026.01); *H10W 74/01* (2026.01); *H10W 74/147* (2026.01);
(Continued)

(58) Field of Classification Search
CPC ......... H01L 24/05; H01L 24/06; H01L 21/56; H01L 23/3192; H01L 2224/0603; H10W 74/47; H10W 74/137; H10W 74/147
See application file for complete search history.

(56) References Cited

U.S. PATENT DOCUMENTS 10,727,318 B2 * 7/2020 Okumura .......... H01L 21/02164
11,244,863 B2 * 2/2022 Maeda .................... H01L 21/78
(Continued)

FOREIGN PATENT DOCUMENTS

DE 102012109484 A1 7/2013
JP 2003207894 A * 7/2003
(Continued)

OTHER PUBLICATIONS

German Office Action issued Apr. 12, 2024 in corresponding German Patent Application No. 112021000701.7, 14 pages.
(Continued)

*Primary Examiner* — Joseph C. Nicely
(74) *Attorney, Agent, or Firm* — XSENSUS LLP

(57) ABSTRACT

A semiconductor device includes a semiconductor layer that has a main surface, a main surface electrode that is arranged at the main surface, an insulating film that partially covers the main surface electrode such as to expose a portion of the main surface electrode, a mold layer that covers the insulating film such as to expose the main surface electrode, and a pad electrode that is arranged on the main surface electrode such as to be electrically connected to the main surface electrode.

17 Claims, 25 Drawing Sheets

(51) Int. Cl.
*H10W 74/10* (2026.01)
*H10D 30/66* (2025.01)

(52) U.S. Cl.
CPC ......... *H10D 30/668* (2025.01); *H10W 72/926* (2026.01); *H10W 72/983* (2026.01)

(56) References Cited

U.S. PATENT DOCUMENTS

| | | | | |
|---|---|---|---|---|
| 2010/0155743 | A1* | 6/2010 | Treu | H10D 30/83<br>257/77 |
| 2020/0126904 | A1 | 4/2020 | Ganitzer et al. | |
| 2021/0066128 | A1* | 3/2021 | Maeda | H01L 23/315 |
| 2021/0234031 | A1* | 7/2021 | Makiyama | H10D 30/015 |
| 2023/0082976 | A1* | 3/2023 | Nakano | H10D 64/117<br>257/77 |
| 2023/0352371 | A1* | 11/2023 | Nakano | H10D 64/256 |

FOREIGN PATENT DOCUMENTS

| | | | |
|---|---|---|---|
| JP | 2011-253862 | A | 12/2011 |
| JP | 2012-79945 | A | 4/2012 |
| JP | 2012169411 | A | 9/2012 |
| JP | 2020-64935 | A | 4/2020 |
| WO | 2015159579 | A1 | 10/2015 |
| WO | 2017/199706 | A1 | 11/2017 |
| WO | 2019/124024 | A1 | 6/2019 |

OTHER PUBLICATIONS

Notice of Reasons for Refusal issued on Jan. 16, 2025 in corresponding Japanese Patent Application No. 2022-519951 (9 pages; with English machine translation).

International Search Report and Written Opinion mailed on Aug. 3, 2021, received for PCT Application PCT/JP2021/017225, filed on Apr. 30, 2021, 11 pages including English Translation.

Office Action dated Apr. 8, 2025 in corresponding German patent application No. 112021000701.7 (6 pages; with English translation).

Notice of Reasons for Refusal (Dispatch date: Jan. 8, 2026) in corresponding Japanese divisional patent application No. 2025-068435 (13 pages; with English translation).

* cited by examiner

FIG. 4

100
104
105
(105s)
101a
101
101b
102
104
105
(105g)
104 z
x
y 100
104
105
(105s)
101
101a
101b
106a
102
104
105
(105g)
104 x
z
y 200
206
VII
VII
205
y
z
x 200
204
204a
204b
206
t6
t4
VIII
204a2
204a1
205a
t5
201
201a
201b
205
202
203
204
206
z
x
y 200
204
204d
204c
204e
x
z
y
206
204c
202
201
203

FIG. 9

300
301
100
302s
302d
302g 300
301
105, 105g
(GATE)
105, 105s
(SOURCE)
100
303s
303g
302g
302d
302s 400
401
100
(200)
402
402

SEMICONDUCTOR DEVICE

CROSS-REFERENCE TO RELATED APPLICATIONS

This application is based on PCT filing PCT/JP2021/017225, filed Apr. 30, 2021, which claims priority to JP 2020-082728, filed on May 8, 2020, the disclosures of each are incorporated herein by reference in their entirety.

TECHNICAL FIELD

The present invention relates to a semiconductor device.

BACKGROUND ART

Patent Literature 1 discloses an art related to a vertical semiconductor element that uses an SiC semiconductor substrate.

CITATION LIST

Patent Literature

Patent Literature 1: Japanese Patent Application Publication No. 2012-79945

SUMMARY OF INVENTION

Technical Problem

One preferred embodiment of the present invention provides a semiconductor device that is improved in reliability.

Solution to Problem

One preferred embodiment of the present invention provides a semiconductor device including a semiconductor layer that has a first main surface and a second main surface that is opposed to the first main surface, a first electrode layer that is formed at the first main surface, a second electrode layer that is formed at the second main surface, an insulating film that covers an end portion of the first electrode layer, a plating layer that covers at least a portion of the first electrode layer other than the end portion, and a mold layer that covers the insulating film.

One preferred embodiment provides a method for manufacturing a semiconductor device including a step of forming a first electrode layer at a first main surface of a semiconductor layer, a step of forming a second electrode layer at a second main surface of a semiconductor layer that is opposed to the first main surface, a step of forming an insulating layer covering an end portion of the first electrode layer, a step of forming a plating layer covering at least a portion of the first electrode layer other than the end portion, and a step of forming a mold layer covering the insulating film.

One preferred embodiment of the present invention provides a semiconductor device including a semiconductor layer having a main surface, a main surface electrode that is arranged at the main surface, an insulating layer that partially covers the main surface electrode such as to expose a part of the main surface electrode, a mold layer that covers the insulating layer such as to expose the main surface electrode, and a pad electrode that is arranged on the main surface electrode such as to be electrically connected to the main surface electrode.

One preferred embodiment of the present invention provides a semiconductor device including semiconductor layer that has a main surface, a main surface electrode that is arranged at the main surface, a photosensitive resin layer that covers a peripheral edge portion of the main surface electrode such as to expose an inner portion of the main surface electrode, a thermosetting resin layer that covers the peripheral edge portion of the main surface electrode across the photosensitive resin layer such as to expose the inner portion of the main surface electrode, and a pad electrode arranged on the inner portion of the main surface electrode.

BRIEF DESCRIPTION OF DRAWINGS

FIG. 4 is a diagram of the detailed arrangement of a semiconductor layer of the semiconductor device shown in FIG. 1.

FIG. 9 is a diagram of an example of a semiconductor package according to a third preferred embodiment.

FIG. 14 is a plan view of a semiconductor device according to a modification example.

DESCRIPTION OF EMBODIMENTS

Preferred Embodiments of the Present Invention shall now be described specifically with reference to the attached drawings. Each of the preferred embodiments described below illustrates a comprehensive or specific example. Numerical values, shapes, materials, constituent elements, arrangement positions of the constituent elements, connection forms of the constituent elements, steps, order of the steps, etc., described with the following preferred embodiments are examples and are not intended to limit the present invention. Among the constituent elements in the following preferred embodiments, a constituent element that is not described in an independent claim is described as an optional constituent element.

The respective attached drawings are schematic views and are not necessarily drawn precisely. For example, the scales, etc., of the attached drawings are thus not necessarily matched. In the attached drawings, arrangements that are substantially the same are provided with the same reference sign and redundant description is omitted or simplified.

In the present description, terms that represent a relationship between elements such as vertical, horizontal, etc., terms that represent shapes of elements such as rectangular, etc., and numerical ranges are not expressions expressing just strict meanings but are expressions meaning to include substantially equivalent ranges.

Also, in the present description, the terms "upper/above" and "lower/below" do not indicate an upper direction (vertically upper) and a lower direction (vertically lower) in terms of an absolute spatial recognition but are used as terms defined by a relative positional relationship based on an order of lamination in a laminated arrangement. Specifically, in the present description, descriptions are provided with a first main surface side at one side of a semiconductor layer being an upper side (above) and a second main surface side at another side being a lower side (below). In actual use of a semiconductor device (vertical transistor), the first main surface side may be a lower side (below) and the second main surface side may be an upper side (above). Or, the semiconductor device (vertical transistor) may be used in an orientation where the first main surface and the second main surface are inclined or orthogonal with respect to a horizontal plane.

Also, the terms "upper/above" and "lower/below" are applied in a case where two constituent elements are provided at an interval from each other such that another constituent element is interposed between the two constituent elements as well as in a case where two constituent elements are provided such that the two constituent elements are adhered closely to each other.

Figure 1:
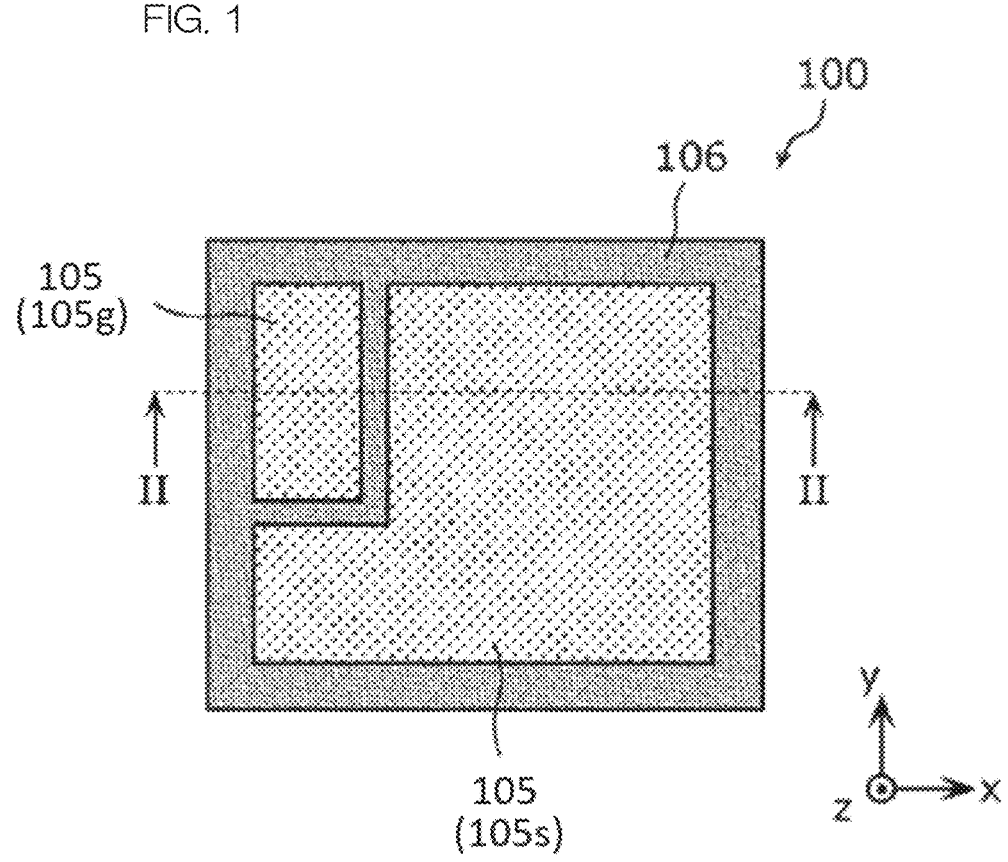
FIG. 1 is a plan view of a semiconductor device according to a first preferred embodiment.
Figure 2:
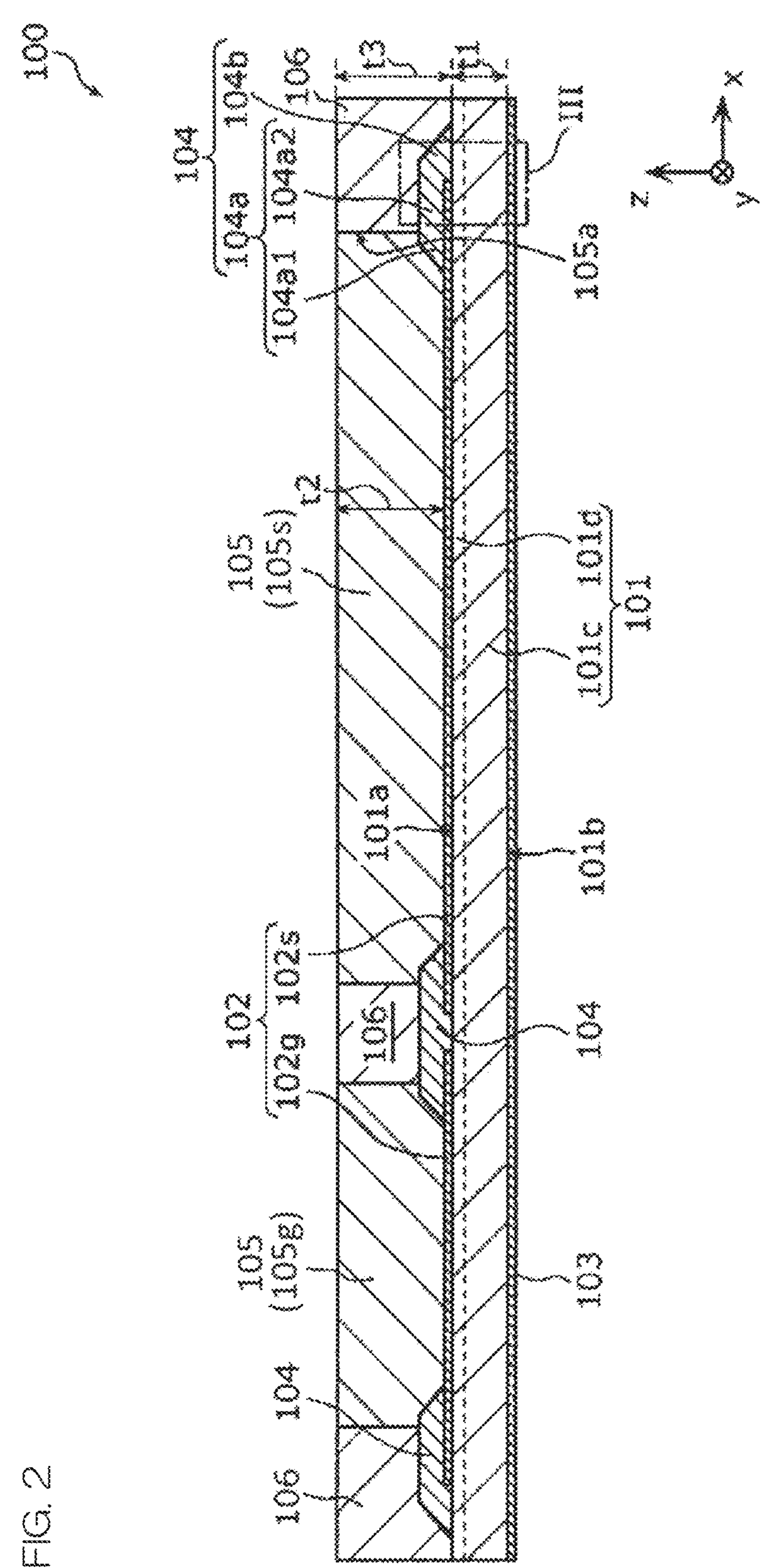
FIG. 2 is a sectional view of the semiconductor device shown in FIG. 1.

The arrangement of a semiconductor device according to a first preferred embodiment shall now be described. FIG. 1 is a plan view of the semiconductor device according to the first preferred embodiment. FIG. 2 is a sectional view (sectional view take along line II-II of FIG. 1) of the semiconductor device shown in FIG. 1.

The semiconductor device 100 shown in FIG. 1 is a semiconductor chip that functions as a MISFET (metal insulator semiconductor field effect transistor) of a vertical type. The semiconductor device 100 is, for example, a power semiconductor device that is used for supply and control of electric power. The semiconductor device 100 specifically includes a semiconductor layer 101, a first electrode layer 102, a second electrode layer 103, an insulating film 104, plating layers 105, and a mold layer 106.

The semiconductor layer 101 is an SiC semiconductor layer that includes an SiC (silicon carbide) monocrystal as an example of a wide bandgap semiconductor. The semiconductor layer 101 is formed to a plate shape with a plan view shape being rectangular. In the present description, plan view means to view from a direction vertical to a first main surface 101*a* or a second main surface 101*b* (to view from a z-axis direction in the figure). Although a length of a side of the semiconductor layer 101 is not less than 1 mm and not more than 10 mm, it may be not less than 2 mm and not more than 5 mm.

The semiconductor layer 101 has the first main surface 101*a* and the second main surface 101*b* that opposes to the first main surface 101*a*. Also, the semiconductor layer 101 includes a semiconductor substrate 101*c* that constitutes the second main surface 101*b* and an epitaxial layer 101*d* that is positioned on the semiconductor substrate 101*c*. The epitaxial layer 101*d* is obtained by epitaxial growth of the semiconductor substrate 101*c*.

A thickness of the semiconductor substrate 101*c* is, for example, not less than 100 μm and not more than 350 μm. A thickness of the epitaxial layer 101*d* is, for example, not less than 5 μm and not more than 20 μm. It is preferred that the thickness t1 of the semiconductor layer 101 (that is, a total thickness of the semiconductor substrate 101*c* and the epitaxial layer 101*d*) is not more than 200 μm. The semiconductor layer 101 is not limited to an SiC semiconductor layer and may be a semiconductor layer constituted of another wide bandgap semiconductor such as GaN, etc., or may be an Si semiconductor layer.

The first electrode layer 102 is formed on the first main surface 101*a*. The first electrode layer 102 may also be referred to as a "first main surface electrode." The first electrode layer 102 includes a first electrode layer 102*g* that functions as a gate electrode and a first electrode layer 102*s* that functions as a source electrode. The first electrode layer 102 is formed, for example, of aluminum. The first electrode layer 102 may be formed of another material such as titanium, nickel, copper, silver, gold, titanium nitride, tungsten, etc.

The first electrode layer 102*s* may have an area of not less than 50% of an area of the semiconductor substrate 101*c* (first main surface 101*a*) in plan view. Preferably, the first electrode layer 102*s* may have an area of not less than 70% of the area of the semiconductor substrate 101*c* (first main surface 101*a*) in plan view. On the other hand, the first electrode layer 102*g* may have an area of not more than 20% of the area of the semiconductor substrate 101*c* (first main surface 101*a*) in plan view. Preferably, the first electrode layer 102*g* may have an area of not more than 10% of the area of the semiconductor substrate 101*c* (first main surface 101*a*) in plan view.

The first electrode layer 102*s* is arranged at a region that includes a central position of the semiconductor substrate 101*c* in plan view. The first electrode layer 102*g* is arranged at a region avoiding the first electrode layer 102*s*. However, the first electrode layer 102*g* may be arranged at a region that includes the central position of the semiconductor substrate 101*c* in plan view and the first electrode layer 102*s* may be arranged such as to surround the first electrode layer 102*g*.

The second electrode layer 103 is formed on the second main surface 101*b*. The second electrode layer 103 may be referred to as a "second main surface electrode." The second electrode layer 103 functions as a drain electrode. The second electrode layer 103 is formed, for example, of a laminated film of titanium, nickel, and gold. The second electrode layer 103 may be formed of another material such as aluminum, copper, silver, titanium nitride, tungsten, etc.

The insulating film 104 covers an entire perimeter of outer peripheral portions (for example, each of both end portions in an x-axis direction and both end portions in an y-axis direction) of the first electrode layer 102. The outer peripheral portions of the first electrode layer 102 may be referred to as peripheral edge portions of the first electrode layer 102. The insulating film 104 includes a first portion 104*a* and a second portion 104*b*. The first portion 104*a* overlaps on the first electrode layer 102. In more detail, the first portion 104*a* overlaps on the peripheral edge portions of the first electrode layer 102. The second portion 104*b* is positioned at outer sides of the first portion 104*a* and covers regions other than the first electrode layer 102. That is, the second portion 104*b* does not ride on the first electrode layer 102.

The first portion 104*a* further includes an inner end portion 104*a*1 and a flat portion 104*a*2. The inner end portion 104*a*1 is an end portion of a portion of the first portion 104*a* that is positioned at inner sides of the semiconductor layer 101 in plan view. The inner end portion 104*a*1 is inclined obliquely downward toward inner portions of the first electrode layer 102 in sectional view. The flat portion 104*a*2 is positioned at outer sides of the inner end portion 104*a*1 (the peripheral edge sides of the semiconductor layer 101) and has a substantially uniform thickness.

The insulating film 104 is, for example, an organic film that includes a photosensitive resin. The insulating film 104 is formed, for example, of a polyamide, a PBO (polybenzoxazole), etc. The insulating film 104 may be an inorganic film that is formed of silicon nitride (SiN) silicon oxide ($SiO_2$), etc. The insulating film 104 may have a single layer structure or may have a laminated structure in which a plurality of types of materials are laminated. If the insulating film 104 has a laminated structure, the insulating film 104 may include both an organic film and an inorganic film. In this case, the insulating film 104 preferably includes an inorganic film and an organic film that are laminated in that order from the first main surface 101*a* side. A thickness of the insulating film 104 is approximately 10 μm at the maximum.

The plating layers 105 are metal layers that cover at least portions of the first electrode layer 102. The plating layers 105 cover at least portions of the first electrode layer 102 other than the end portions (that is, the portions covered by the insulating film 104). As shown in FIG. 1, the plating layers 105 are surrounded by the mold layer 106 in plan view. The plating layers 105 include a plating layer 105(*g*) (first plating layer) at the first electrode layer 102*g* side and a plating layer 105*s* (second plating layer) at the first electrode layer 102*s* side.

The plating layer 105*g* that is formed on the first electrode layer 102*g* functions as a gate pad (pad electrode) with a plan view shape being rectangular. The plating layer 105*s* that is formed on the first electrode layer 102*s* functions as a source pad (pad electrode). A pad is a portion to which a bonding wire is bonded when the semiconductor device 100 is packaged. Also, the plating layers 105 function as supporting members of the mold layer 106 as well.

The plating layers 105 are, for example, formed of a material differing from the first electrode layer 102. The plating layers 105 are formed, for example, of copper or a copper alloy having copper as a main component. The plating layers 105 may be formed of another metal material. The thickness t2 of the plating layers 105 is greater than the thickness of the insulating film 104. In more detail, the thickness t2 of the plating layers 105 is greater than the maximum thickness of the insulating film 104 positioned on the first electrode layer 102. Topmost portions of the plating layers 105 are thereby higher than a topmost portion of the insulating film 104. The thickness t2 of the plating layers 105 is, for example, not less than 30 μm and not more than 100 μm. The thickness t2 of the plating layers 105 may be not less than 100 μm and not more than 200 μm.

Side surfaces 105*a* of the plating layers 105 extend vertically or substantially vertically. The side surfaces 105*a* do not necessarily have to extend rectilinearly in sectional view and can include a curve or unevenness. The side surfaces 105*a* are positioned in regions in which both the first electrode layer 102 and the insulating film 104 overlap mutually. In more detail, the side surfaces 105*a* are positioned on the flat portion 104*a*2 of the insulating film 104. That is, the plating layers 105 cover the inner end portion 104*a*1 and the flat portion 104*a*2 of the first portion 104*a*. By the side surfaces 105*a* being positioned on the flat portion 104*a*2, the plating layers 105 can be formed with stability in comparison to a case where the side surfaces 105*a* are positioned on the inner end portion 104*a*1 that is comparatively large in variation in thickness.

The mold layer 106 is a resin layer that covers at least a portion of the insulating film 104. In this embodiment, the mold layer 106 also covers a portion of the first main surface 101*a*. The mold layer 106 is positioned at outer peripheral portions at the first main surface 101*a* side of the semiconductor layer 101. The outer peripheral portions of the semiconductor layer 101 (first main surface 101*a*) may be referred to as peripheral edge portions of the semiconductor layer 101 (first main surface 101*a*).

In plan view, the mold layer 106 has a rectangular annular shape oriented along the outer peripheral portions of the semiconductor layer 101. Also, the mold layer 106 is positioned between the gate pad (plating layer 105*g* on the first electrode layer 102*g*) and the source pad (plating layer 105*s* on the first electrode layer 102*s*) as well. That is, the mold layer 106 is formed just on the first main surface 101*a* of the semiconductor layer 101 and exposes the second main surface 101*b* and side surfaces of the semiconductor layer 101.

Inner side surfaces of the mold layer 106 are in direct contact with the side surfaces 105*a* of the plating layers 105. The inner side surfaces of the mold layer 106 the mold layer 106 include inner side surfaces at the first electrode layer 102*g* side (first inner side surfaces) and inner side surfaces at the first electrode layer 102*s* side (second inner side surfaces). The mold layer 106 is formed, for example, of a thermosetting resin (epoxy resin). The mold layer 106 may be formed of an epoxy resin that includes carbon and glass fibers, etc. The thickness t3 of the mold layer 106 is, for example, not less than 30 μm and not more than 100 μm. The thickness t3 of the mold layer 106 may be not less than 100 μm and not more than 200 μm. An upper surface of the mold layer 106 and upper surfaces of the plating layers 105 are flush or substantially flush.

The source pad may have an area of not less than 50% of the area of the semiconductor substrate 101*c* (first main surface 101*a*) in plan view. Preferably, the source pad may have an area of not less than 70% of the area of the semiconductor substrate 101*c* (first main surface 101*a*) in plan view. On the other hand, the gate pad may have an area of not more than 20% of the area of the semiconductor substrate 101*c* (first main surface 101*a*) in plan view.

Preferably, the gate pad may have an area of not more than 10% of the area of the semiconductor substrate 101*c* (first main surface 101*a*) in plan view.

The source pad is arranged at a region that includes the central position of the semiconductor substrate 101*c* in plan view. The gate pad is arranged at a region avoiding the source pad. However, the gate pad may be arranged at a region that includes the central position of the semiconductor substrate 101*c* in plan view and the source pad may be arranged such as to surround the gate pad.

Figure 3:
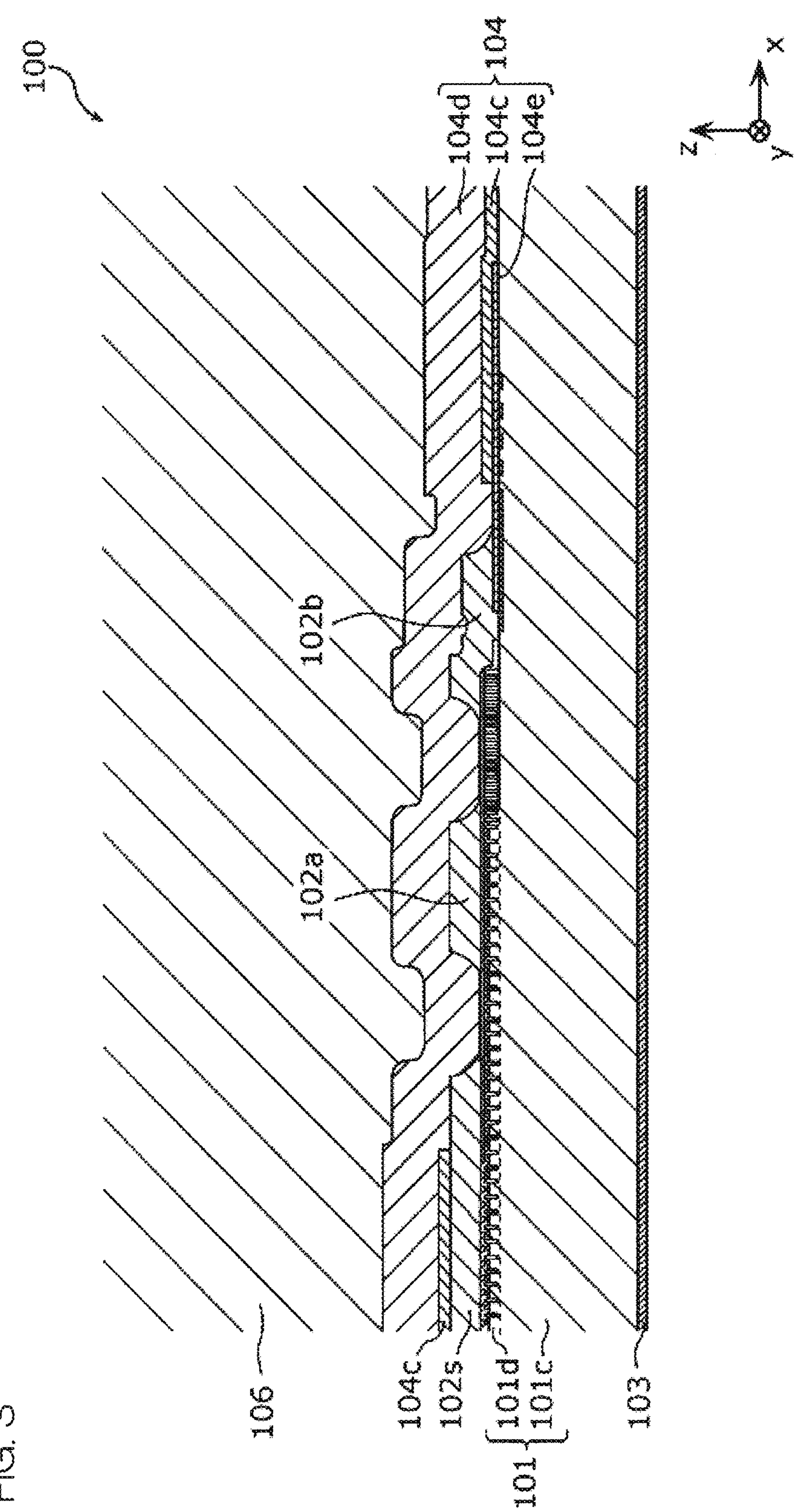
FIG. 3 is a diagram of the detailed arrangement of an outer peripheral portion of the semiconductor device shown in FIG. 1.

Next, the detailed arrangement of an outer peripheral portion (in other words, an end portion) of the semiconductor device 100 shall be described. FIG. 3 is a diagram of the detailed arrangement of the outer peripheral portion of the semiconductor device 100 (sectional view showing details of a region III of FIG. 2). In FIG. 3, a gate finger 102*a* and an outer peripheral source contact 102*b* are illustrated in addition to the first electrode layer 102*s*.

The end portions of the first electrode layer 102*s* are covered by the insulating film 104. Specifically, the insulating film 104 includes a first insulating film 104*c* positioned on the first electrode layer 102*s* and a second insulating film 104*d* positioned on the first insulating film 104*c*. The first insulating film 104*c* is an inorganic film formed of silicon nitride, silicon oxide, etc. The second insulating film 104*d* is an organic film formed of a polyimide, a PBO, etc.

Also, the insulating film 104 includes a third insulating film 104*e* positioned below the outer peripheral source contact 102*b*. In more detail, the third insulating film 104*e* is positioned between the outer peripheral source contact 102*b* and the semiconductor layer 101. The third insulating film 104*e* is an inorganic film formed of silicon nitride, silicon oxide, etc.

In a general semiconductor device, such an insulating film 104 is arranged to suppress entry of moisture into the end portions of the first electrode layer 102*s*, occurrence of ion migration, etc. However, when a durability test under an environment of high temperature and humidity or a reliability test such as a temperature cycle test, etc., is performed, there is a possibility for the insulating film 104 to degrade to cause moisture to enter from a degraded location or ion migration to occur at the degraded location, etc. That is, degradation of the insulating film 104 may become a cause of malfunction of the semiconductor device.

Thus, with the semiconductor device 100, the insulating film 104 is further covered by the mold layer 106. Thereby, the degradation of the insulating film 104 is suppressed and reliability of the semiconductor device 100 is improved.

Although the end portions of the first electrode layer 102*s*, the gate finger 102*a*, and the outer peripheral source contact 102*b* are basically covered by the first insulating film 104*c*, in the example of FIG. 3, endmost portions of the first electrode layer 102*s*, the gate finger 102*a*, and the outer peripheral source contact 102*b* are covered by the second insulating film 104*d* and the first insulating film 104*c* is omitted. Stress is relaxed by such a structure.

Figure 4:
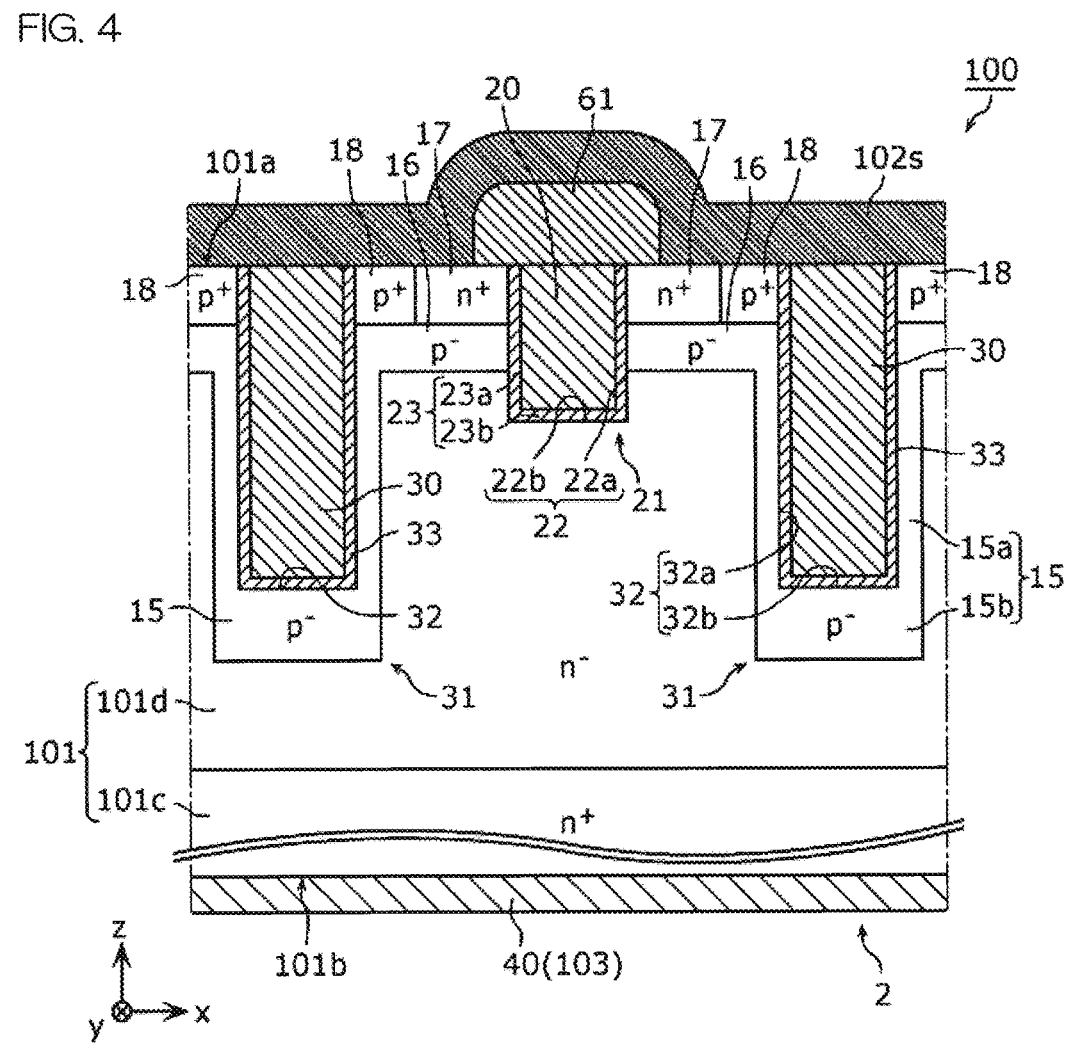

Next, the detailed structure of the semiconductor layer 101 shall be described. FIG. 4 is a diagram of the detailed arrangement of a semiconductor layer 101. In FIG. 4, hatching expressing a section is not applied to the semiconductor layer 101 from a standpoint of viewability of the drawing. As shown in FIG. 3 and FIG. 4, the semiconductor layer 101 specifically includes the semiconductor substrate 101*c* and the epitaxial layer 101*d*.

The semiconductor device 100 shown in FIG. 4 is an example of a switching device and includes a vertical transistor 2. The vertical transistor 2 is, for example, a MISFET of a vertical type. As shown in FIG. 4, the semiconductor device 100 includes the semiconductor layer 101, gate electrodes 20, source electrodes 30, and a drain electrode 40. The drain electrode 40 corresponds to the second electrode layer 103.

The semiconductor layer 101 includes a semiconductor layer 101 that includes SiC (silicon carbide) as a main component. Specifically, the semiconductor layer 101 is an SiC semiconductor layer of an n-type that includes an SiC monocrystal. The SiC monocrystal is, for example, a 4H-SiC monocrystal.

The 4H-SiC monocrystal has an off angle of being inclined at an angle of within 10° with respect to a [11-20] direction from a (0001) plane. The off angle may be not less than 0° and not more than 4°. The off angle may exceed 0° and be less than 4°. The off angle is set, for example, to 2° or 4°, to within a range of 2°±0.2°, or to within a range of 4°±0.4°.

The semiconductor layer 101 is formed to a chip of rectangular parallelepiped shape. The semiconductor layer 101 has the first main surface 101*a* and the second main surface 101*b*. The semiconductor layer 101 has the semiconductor substrate 101*c* and the epitaxial layer 101*d*. The semiconductor substrate 101*c* includes the SiC monocrystal. A lower surface of the semiconductor substrate 101*c* is the second main surface 101*b*. This second main surface 101*b* is a carbon plane (000-1) surface at which the carbon of the SiC crystal is exposed. The epitaxial layer 101*d* is laminated on an upper surface of the semiconductor substrate 101*c* and is an SiC semiconductor layer of an n-type that includes the SiC monocrystal. An upper surface of the epitaxial layer 101*d* is the first main surface 101*a*. This first main surface 101*a* is a silicon plane (0001) surface at which the silicon of the SiC crystal is exposed.

The drain electrode 40 is connected to the second main surface 101*b* of the semiconductor layer 101. The semiconductor substrate 101*c* is arranged as a drain region of an $n^+$-type. The epitaxial layer 101*d* is arranged as a drain drift region of the n-type.

An n-type impurity concentration of the semiconductor substrate 101*c* is, for example, not less than $1.0\times10^{18}$ $cm^{-3}$ and not more than $1.0\times10^{21}$ $cm^{-3}$. An n-type impurity concentration of the epitaxial layer 101*d* is lower than the n-type impurity concentration of the semiconductor substrate 101*c* and is, for example, not less than $1.0\times10^{15}$ $cm^{-3}$ and not more than $1.0\times10^{17}$ $cm^{-3}$. In the present description, the "impurity concentration" means a peak value of the impurity concentration.

As shown in FIG. 4, the epitaxial layer 101*d* of the semiconductor layer 101 includes deep well regions 15, a body region 16, source regions 17, and contact regions 18.

The deep well regions 15 are formed in regions of the semiconductor layer 101 along source trenches 32. The deep well regions 15 are also referred to as withstand voltage holding regions. The deep well regions 15 are semiconductor regions of a $p^-$-type. A p-type impurity concentration of the deep well regions 15 is, for example, not less than $1.0\times10^{17}$ $cm^{-3}$ and not more than $1.0\times10^{19}$ $cm^{-3}$. The p-type impurity concentration of the deep well regions 15 is, for example, higher than the n-type impurity concentration of the epitaxial layer 101*d*.

The deep well regions 15 include side wall portions 15*a* oriented along side walls 32*a* of the source trenches 32 and bottom wall portions 15*b* oriented along bottom walls 32*b* of the source trenches 32. A thickness (length in the z-axis direction) of the bottom wall portions 15*b* is, for example, not less than a thickness (length in the x-axis direction) of the side wall portions 15*a*. At least a portion of each bottom wall portion 15*b* may be positioned inside the semiconductor substrate 101*c*.

The body region 16 is a semiconductor region of the $p^-$-type that is arranged in a surface layer portion of the first main surface 101*a* of the semiconductor layer 101. The body region 16 is arranged between gate trenches 22 and the source trenches 32 in plan view. The body region 16 is arranged as a band extending along the y-axis direction in plan view. The body region 16 is continuous to the deep well regions 15.

A p-type impurity concentration of the body region 16 is, for example, not less than $1.0\times10^{16}$ $cm^{-3}$ and not more than $1.0\times10^{19}$ $cm^{-3}$. The p-type impurity concentration of the body region 16 may be equal to impurity regions of the deep well regions 15. The p-type impurity concentration of the body region 16 may be higher than the p-type impurity concentration of the deep well regions 15.

The source regions 17 are semiconductor regions of the $n^+$-type that are arranged in the surface layer portion of the first main surface 101*a* of the semiconductor layer 101. The source regions 17 are portions of the body region 16. The source regions 17 are arranged in regions along the gate trenches 22. The source regions 17 contact gate insulating layers 23.

The source regions 17 are arranged as bands extending along the y-axis direction in plan view. A width (length in the x-axis direction) of the source regions 17 is, for example, not less than 0.2 μm and not more than 0.6 μm. As an example, the width of the source regions 17 may be approximately 0.4 μm. An n-type impurity concentration of the source regions 17 is, for example, not less than $1.0\times10^{18}$ $cm^{-3}$ and not more than $1.0\times10^{21}$ $cm^{-3}$.

The contact regions 18 are semiconductor regions of a $p^+$-type that are arranged in the surface layer portion of the first main surface 101*a* of the semiconductor layer 101. The contact regions 18 may be regarded to be portions (high concentration portions) of the body region 16. The contact regions 18 are arranged in regions along the source trenches 32. The contact regions 18 contact barrier forming layers 33. Also, the contact regions 18 are connected to the source regions 17.

The contact regions 18 are arranged as bands extending along the y-axis direction in plan view. A width (length in the x-axis direction) of the contact regions 18 is, for example, not less than 0.1 μm and not more than 0.4 μm. As an example, the width of the contact regions 18 may be approximately 0.2 μm. A p-type impurity concentration of the contact regions 18 is, for example, not less than $1.0\times10^{18}$ $cm^{-3}$ and not more than $1.0\times10^{21}$ $cm^{-3}$.

A plurality of trench gate structures 21 and a plurality of trench source structures 31 are arranged in the first main surface 101*a* of the semiconductor layer 101. The trench gate structures 21 and the trench source structures 31 are arranged such as to be repeated one by one alternately along the x-axis direction. In FIG. 4, just a range in which one trench gate structure 21 is sandwiched by two trench source structures 31 is shown.

The trench gate structures 21 and the trench source structures 31 are both arranged as bands extending in the y-axis direction. For example, the x-axis direction is the [11-20] direction and the y-axis direction is a [1-100] direction. The x-axis direction may be the [1-100] direction ([−1100] direction). In this case, the y-axis direction may be the [11-20] direction.

The trench gate structures 21 and the trench source structures 31 are aligned alternately along the x-axis direction and form a stripe structure in plan view. A distance between a trench gate structure 21 and the trench source structure 31 is, for example, not less than 0.3 μm and not more than 1.0 μm.

As shown in FIG. 4, each trench gate structure 21 includes a gate trench 22, a gate insulating layer 23, and a gate electrode 20.

The gate trench 22 is formed by digging into the first main surface 101*a* of the semiconductor layer 101 toward the second main surface 101*b* side. The gate trench 22 is a recess portion of elongate groove shape that extends along the y-axis direction and is rectangular in cross-sectional shape in an xz-section. The gate trench 22 has a length of a millimeter order in a length direction (y-axis direction). The gate trench 22 has a length, for example, of not less than 1 mm and not more than 10 mm. The length of the gate trench 22 may be not less than 2 mm and not more than 5 mm. A total extension of one or the plurality of gate trenches 22 per unit area may be not less than 0.5 μm/μm2 and not more than 0.75 μm/μm2.

The gate insulating layer 23 is arranged as a film along a side wall 22*a* and a bottom wall 22*b* of the gate trench 22. The gate insulating layer 23 demarcates a space of recessed shape in an interior of the gate trench 22. The gate insulating layer 23 includes, for example, silicon oxide. The gate insulating layer 23 may include at least one type of substance among undoped silicon, silicon nitride, aluminum oxide, aluminum nitride, or aluminum oxynitride.

A thickness of the gate insulating layer 23 is, for example, not less than 0.01 μm and not more than 0.5 μm. The thickness of the gate insulating layer 23 may be uniform or may differ according to part. For example, the gate insulating layer 23 includes a side wall portion 23*a* along the side wall 22*a* of the gate trench 22 and a bottom wall portion 23*b* along the bottom wall 22*b* of the gate trench 22. A thickness of the bottom wall portion 23*b* may be thicker than a thickness of the side wall portion 23*a*. The thickness of the bottom wall portion 23*b* is, for example, not less than 0.01 μm and not more than 0.2 μm. The thickness of the side wall portion 23*a* is, for example, not less than 0.05 μm and not more than 0.5 μm. Also, the gate insulating layer 23 may include an upper surface portion arranged on upper surfaces of the source regions 17 at outer sides of the gate trench 22. A thickness of the upper surface portion may be thicker than the thickness of the side wall portion 23*a*.

The gate electrode 20 is an example of a control electrode of the vertical transistor 2. The gate electrode 20 is embedded in the gate trench 22. The gate insulating layer 23 is arranged between the gate electrode 20 and the side wall 22*a* and bottom wall 22*b* of the gate trench 22. That is, the gate electrode 20 is embedded in the space of recessed shape demarcated by the gate insulating layer 23. The gate electrode 20 is a conductive layer that includes, for example, a conductive polysilicon. The gate electrode 20 may include at least one type of substance among metals such as titanium, nickel, copper, aluminum, silver, gold, tungsten, etc., or conductive metal nitrides such as titanium nitride, etc.

An aspect ratio of the trench gate structure 21 is defined by a ratio of a depth (length in the z-axis direction) of the trench gate structure 21 with respect to a width (length in the x-axis direction) of the trench gate structure 21. The aspect ratio of the trench gate structure 21 is, for example, the same as an aspect ratio of the gate trench 22. The aspect ratio of the trench gate structure 21 is, for example, not less than 0.25 and not more than 15.0. The width of the trench gate structure 21 is, for example, not less than 0.2 μm and not more than 2.0 μm. As an example, the width of the trench gate structure 21 may be approximately 0.4 μm. The depth of the trench gate structure 21 is, for example, not less than 0.5 μm and not more than 3.0 μm. As an example, the depth of the trench gate structure 21 may be approximately 1.0 μm.

As shown in FIG. 4, each trench source structure 31 includes a deep well region 15, a source trench 32, a barrier forming layer 33, and a source electrode 30.

The source trench 32 is formed by digging into the first main surface 101*a* of the semiconductor layer 101 toward the second main surface 101*b* side. The source trench 32 is a recess portion of elongate groove shape that extends along the y-axis direction and is rectangular in cross-sectional shape in the xz section. The source trench 32 is, for example, deeper than the gate trench 22. That is, the bottom wall 32*b* of the source trench 32 is positioned further toward the second main surface 101*b* side than the bottom wall 22*b* of the gate trench 22.

The barrier forming layer 33 is arranged as a film along a side wall 32*a* and the bottom wall 32*b* of the source trench 32. The barrier forming layer 33 demarcates a space of recessed shape in an interior of the source trench 32. The barrier forming layer 33 is formed using a material differing from the source electrode 30. The barrier forming layer 33 has a higher potential barrier than a potential barrier between the source electrode 30 and the deep well region 15.

The barrier forming layer 33 is a barrier forming layer with an insulating property. In this case, the barrier forming layer 33 includes at least one type of substance among undoped silicon, silicon oxide, silicon nitride, aluminum oxide, aluminum nitride, or aluminum oxynitride. The barrier forming layer 33 may be formed using the same material as the gate insulating layer 23. In this case, the barrier forming layer 33 may have the same film thickness as the gate insulating layer 23.

For example, if the barrier forming layer 33 and the gate insulating layer 23 are formed using silicon oxide, these may be formed at the same time by a thermal oxidation treatment method. The barrier forming layer 33 may be a barrier forming layer with a conductive property. In this case, the barrier forming layer 33 includes at least one type of substance among a conductive polysilicon, tungsten, platinum, nickel, cobalt, or molybdenum.

The source electrode 30 is embedded in the source trench 32. The barrier forming layer 33 is arranged between the source electrode 30 and the side wall 32*a* and bottom wall 32*b* of the source trench 32. That is, the source electrode 30 is embedded in the space of recessed shape demarcated by the barrier forming layer 33.

The source electrode 30 is a conductive layer that includes, for example, a conductive polysilicon. The source electrode 30 may be an n-type polysilicon doped with an n-type impurity or a p-type polysilicon doped with a p-type impurity. The source electrode 30 may include at least one type of substance among metals such as titanium, nickel, copper, aluminum, silver, gold, tungsten, etc., or conductive metal nitrides such as titanium nitride, etc. The source electrode 30 may be formed using the same material as the gate electrode 20. In this case, the source electrode 30 and the gate electrode 20 can be formed in the same step.

An aspect ratio of the trench source structure 31 is defined by a ratio of a depth (length in the z-axis direction) of the trench source structure 31 with respect to a width (length in the x-axis direction) of the trench source structure 31. The width of the trench source structure 31 is, for example, a sum of a width of the source trench 32 and a width of a side wall portion 15*a* of the deep well region 15 that is positioned at both sides of the source trench 32. The width of the trench source structure 31 is, for example, not less than 0.6 μm and not more than 2.4 μm.

As an example, the width of the trench source structure 31 may be approximately 0.8 μm. The depth of the trench source structure 31 is a sum of a depth of the source trench 32 and a thickness of the bottom wall portion 15*b* of the deep well region 15. The depth of the trench source structure 31 is, for example, not less than 1.5 μm and not more than 11 μm. As an example, the depth of the trench source structure 31 may be approximately 2.5 μm.

The aspect ratio of the trench source structure 31 is greater than the aspect ratio of the trench gate structure 21. The aspect ratio of the trench source structure 31 is, for example, not less than 1.5 and not more than 4.0. By making the depth of the trench source structure 31 large, a withstand voltage holding effect due to a super junction (SJ) structure can be enhanced.

The drain electrode 40 corresponds to the second electrode layer 103. The drain electrode 40 may include at least one type of substance among titanium, nickel, copper, aluminum, gold, or silver. For example, the drain electrode 40 may have a four layer structure that includes a Ti layer, an Ni layer, an Au layer, and an Ag layer that are laminated successively from the second main surface 101*b* of the semiconductor layer 101. The drain electrode 40 may have a four layer structure that includes a Ti layer, an AlCu layer, an Ni layer, and an Au layer that are laminated successively from the second main surface 101*b* of the semiconductor layer 101. An AlCu layer is an alloy layer of aluminum and copper.

The drain electrode 40 may have a four layer structure that includes a Ti layer, an AlSiCu layer, an Ni layer, and an Au layer that are laminated successively from the second main surface 101*b* of the semiconductor layer 101. An AlSiCu layer is an alloy layer of aluminum, silicon, and copper. The drain electrode 40 may include, in place of a Ti layer, a single layer structure that is constituted of a TiN layer or a laminated structure that includes a Ti layer and a TiN layer.

The semiconductor device 100 that is arranged as described above can switch, in accordance with a gate voltage applied to the gate electrodes 20 of the vertical transistor 2, between an on state in which a drain current flows and an off state in which the drain current does not flow. The gate voltage is, for example, a voltage of not less than 10 V and not more than 50 V. As an example, the gate voltage may be 30 V. A source voltage that is applied to the source electrodes 30 is, for example, a reference voltage such as a ground voltage (0 V), etc. The drain voltage that is applied to the drain electrode 40 is a voltage of a magnitude not less than the source voltage. The drain voltage is, for example, a voltage of a magnitude of not less than 0 V and not more than 10000 V. The drain voltage may be a voltage of a magnitude of not less than 1000 V.

When the gate voltage is applied to the gate electrodes 20, channels are formed in portions of the body region 16 of the $p^-$-type that are in contact with the gate insulating layers 23. Thereby, current paths passing from the source electrodes 30 and successively through the contact regions 18, the source regions 17, the channels of the body region 16, the epitaxial layer 101*d*, and the semiconductor 101*c* and reaching the drain electrode 40 are formed. The drain electrode 40 is of higher potential than the source electrodes 30 and therefore, the drain current flows from the drain electrode 40, successively through the semiconductor substrate 101*c*, the epitaxial layer 101*d*, the channels of the body region 16, the source regions 17, and the contact region 18, and into the source electrodes 30. The drain current thus flows along a thickness direction of the semiconductor device 100.

pn-junctions are formed between the deep well regions 15 of the $p^-$-type and the epitaxial layer 101*d* of the n-type. In the on state of the vertical transistor 2, the source voltage is applied via the source electrodes 30 to the deep well regions 15 of the $p^-$-type and the drain voltage that is greater than the source voltage is applied via the drain electrode 40 to the epitaxial layer 101*d* of the n-type.

That is, a reverse bias voltage is applied to the pn-junctions between the deep well regions 15 and the epitaxial layer 101*d*. The n-type impurity concentration of the epitaxial layer 101*d* is lower than the p-type impurity concentration of the deep well regions 15 and therefore, depletion layers spread toward the drain electrode 40 from interfaces between the deep well regions 15 and the epitaxial layer 101*d*. A withstand voltage of the vertical transistor 2 can thereby be increased.

The source electrodes 30 are electrically connected to the first electrode layer 102*s* arranged on the source electrodes 30. The gate electrodes 20 are insulated from the first electrode layer 102*s* by insulating layers 61 and are electrically connected to the first electrode layers 102*g* via gate fingers (for example, the gate finger 102*a* of FIG. 3, etc.) arranged on an upper side of the outer peripheral portion of the semiconductor layer 101, etc. The insulating layers 61 include, for example, silicon oxide or silicon nitride as a main component.

Figure 5A:
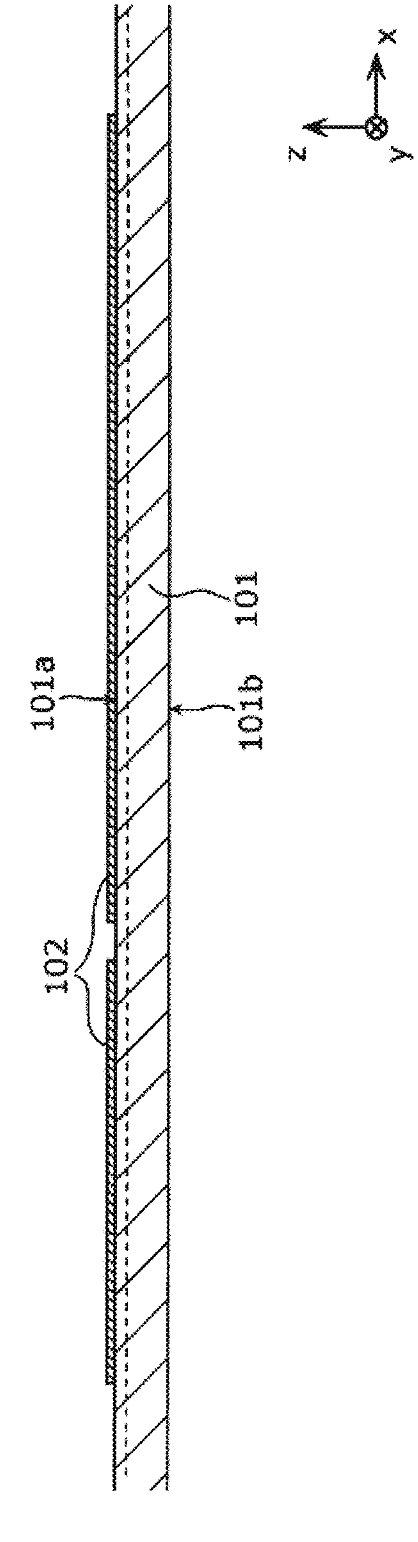
FIG. 5A is a first sectional view of a method for manufacturing the semiconductor device shown in FIG. 1.

Next, a method for manufacturing the semiconductor device 100 shall be described. FIG. 5A to FIG. 5F are sectional views of the method for manufacturing the semiconductor device 100. First, as shown in FIG. 5A, the semiconductor layer 101 is formed and the first electrode layer 102 is formed on the first main surface 101*a* of the semiconductor layer 101. Any of various existing methods is used as a method for forming the semiconductor layer 101. The first electrode layer 102 is formed, for example, by a sputtering method, a vapor deposition method, etc.

Figure 5B:
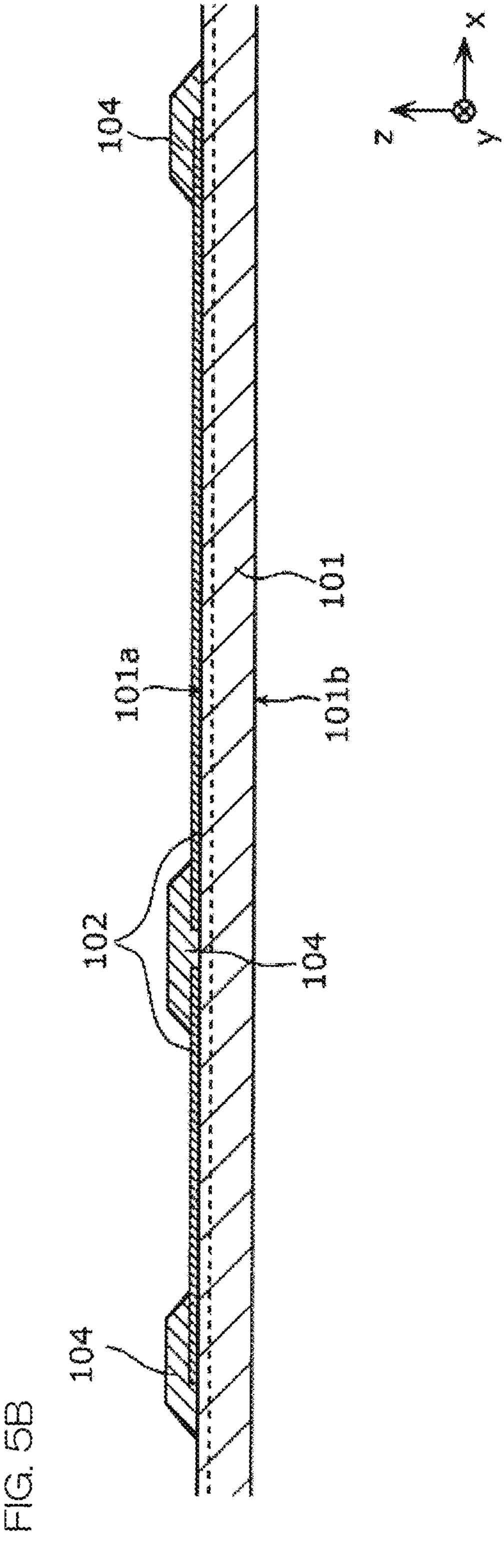
FIG. 5B is a second sectional view of the method for manufacturing the semiconductor device shown in FIG. 1.

Next, as shown in FIG. 5B, outer peripheral portions of the first electrode layer 102 are covered by the insulating film 104. The insulating film 104 is formed, for example, through a coating step and an exposure development step. In the coating step, a photosensitive resin material that is to be a base of the insulating film 104 is coated by a spin coating method onto the first electrode layer 102. In the exposure development step, the photosensitive resin material is cured by exposure and thereafter, unnecessary portions of the photosensitive resin material are removed by an ashing method or a wet etching method, etc. The insulating film 104 is thereby formed.

Figure 5C:
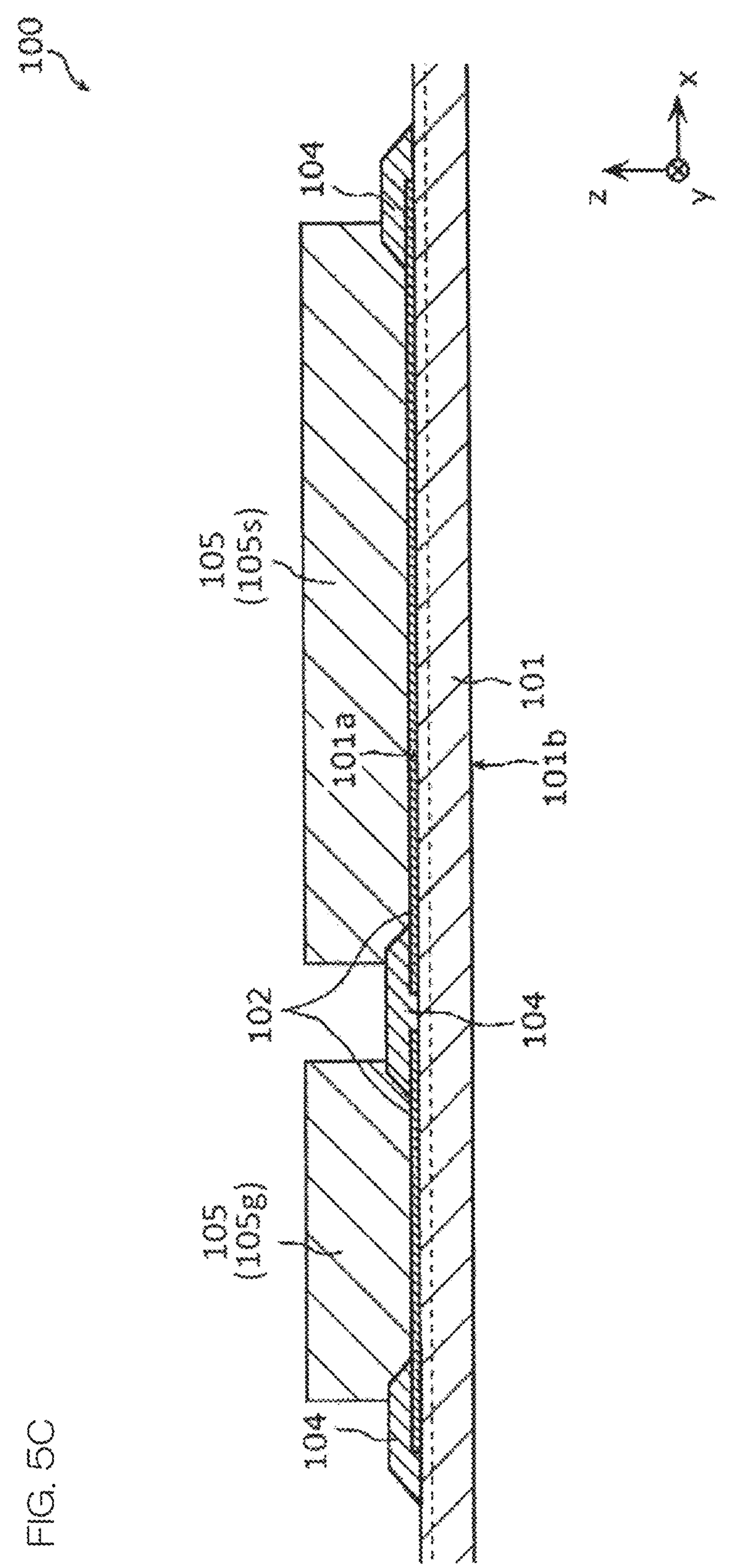
FIG. 5C is a third sectional view of the method for manufacturing the semiconductor device shown in FIG. 1.

Next, as shown in FIG. 5C, the plating layers 105 are formed on the first electrode layer 102. The plating layers 105 are formed on the first electrode layer 102, for example, by an electroplating method or an electroless plating method. The plating layers 105 are selectively and partially formed on at least portions of the first electrode layer 102 that are not covered by the insulating film 104.

Figure 5D:
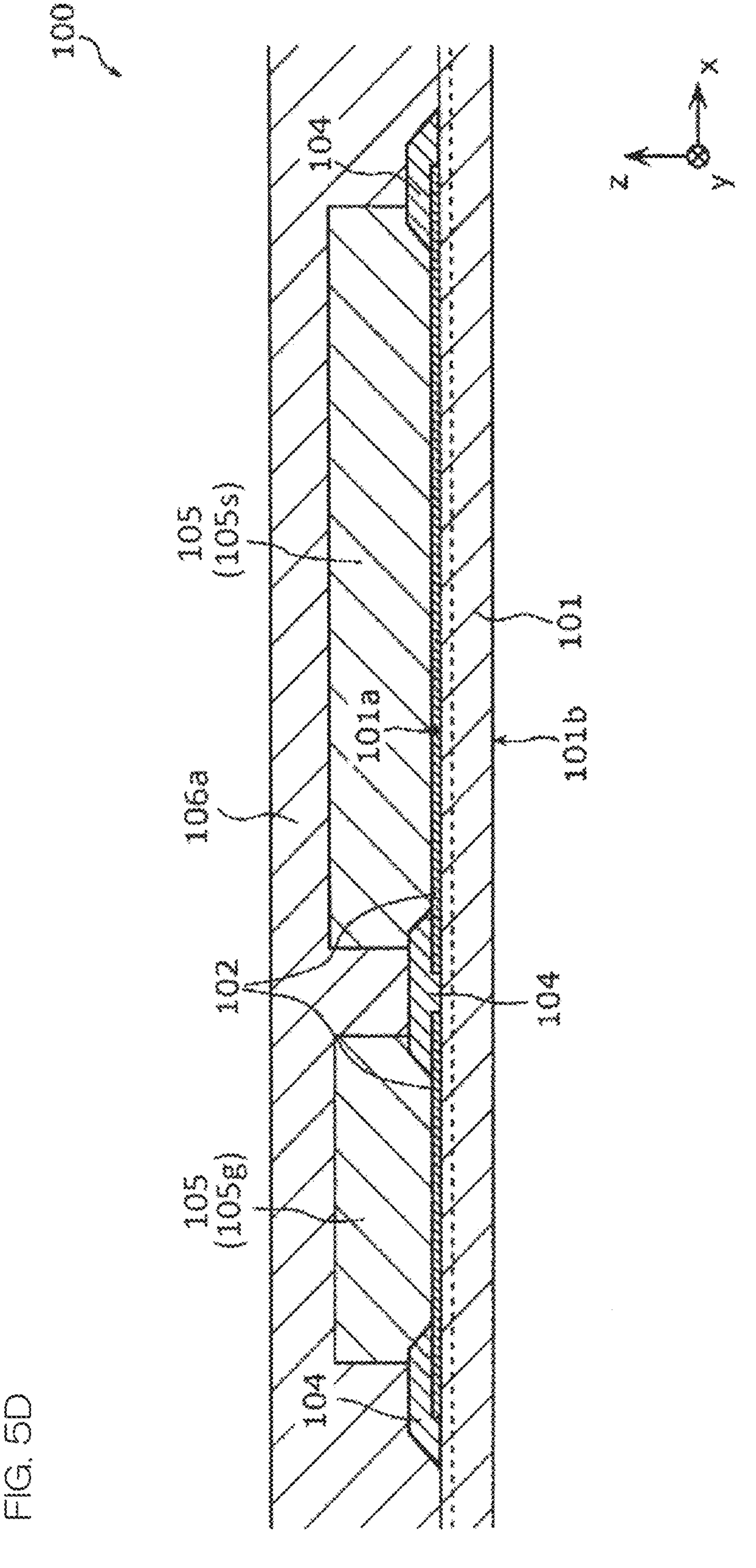
FIG. 5D is a fourth sectional view of the method for manufacturing the semiconductor device shown in FIG. 1.

Next, as shown in FIG. 5D, a resin material 106*a* (for example, a thermosetting resin) of a liquid form that is to be a base of the mold layer 106 is coated or printed on an entire surface at the first main surface 101*a* side of the semiconductor layer 101. Consequently, the insulating film 104 and the plating layers 105 are covered by the resin material 106*a*. Also, the resin material 106*a* enters in between the plating layer 105*g* on the first electrode layer 102*g* and the plating layer 105*s* on the first electrode layer 102*s* as well. The coated or printed resin material 106*a* is cured, for example, by heating.

Figure 5E:
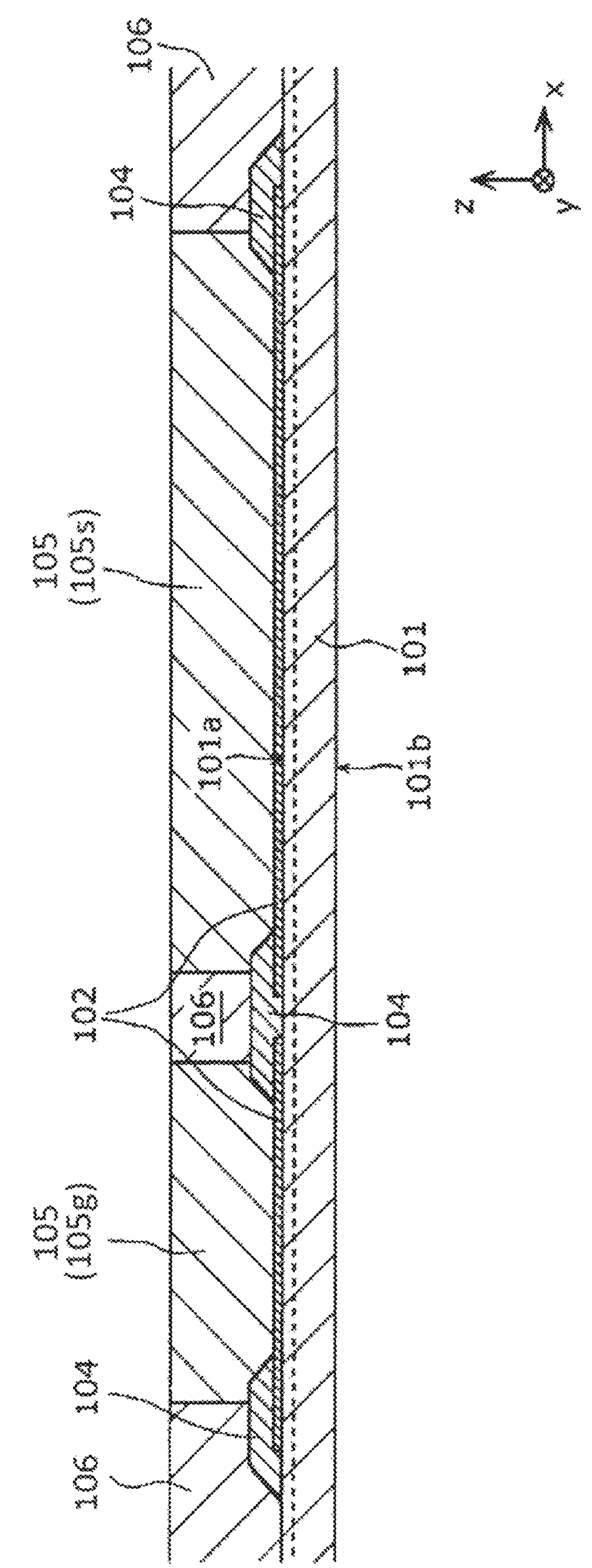
FIG. 5E is a fifth sectional view of the method for manufacturing the semiconductor device shown in FIG. 1.

Next, as shown in FIG. 5E, an upper surface (front surface) of the resin material 106*a* is ground until the plating layers 105 are exposed. Consequently, the upper surfaces (front surfaces) of the plating layers 105 and the upper surface (front surface) of the mold layer 106 become flush. That is, the upper surfaces (front surfaces) of the plating layers 105 and the upper surface (front surface) of the mold layer 106 are constituted of ground surfaces that are continuous to each other.

Figure 5F:
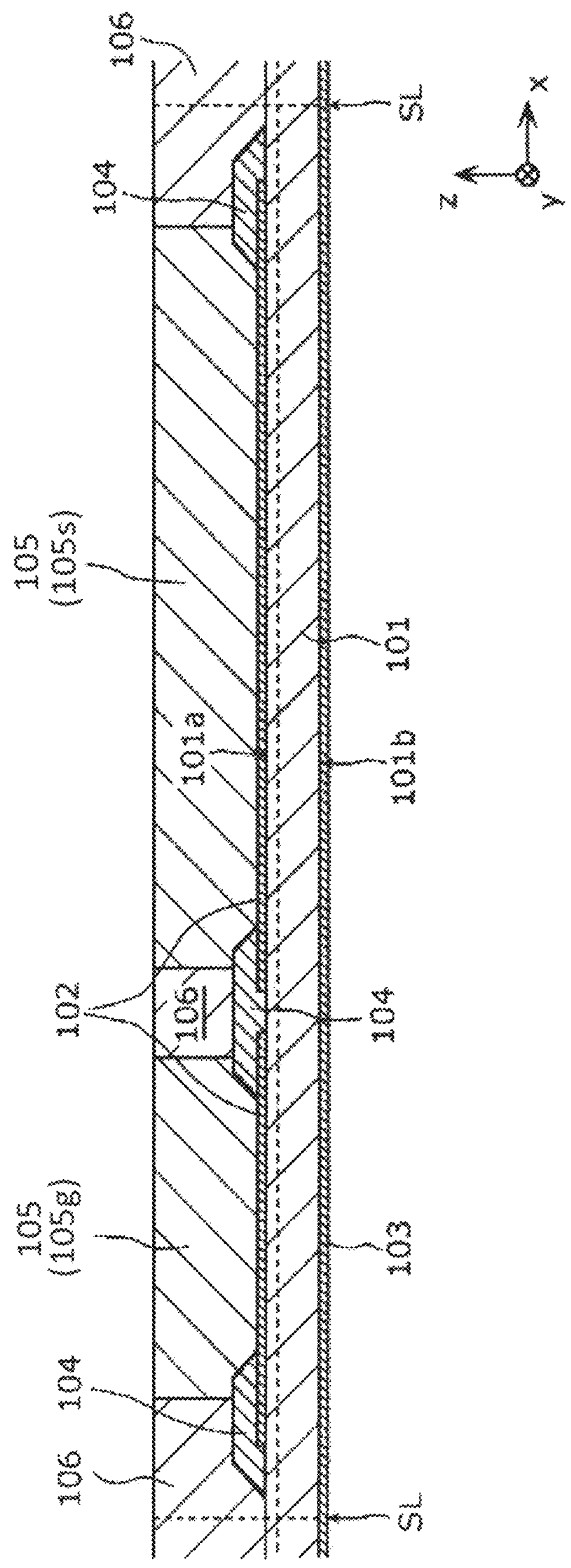
FIG. 5F is a sixth sectional view of the method for manufacturing the semiconductor device shown in FIG. 1.

Next, as shown in FIG. 5F, the second electrode layer 103 is formed on the second main surface 101*b* of the semiconductor layer 101. The second electrode layer 103 is formed, for example, by a sputtering method, a vapor deposition method, etc. Lastly, by a wafer being cut along scribe lines SL by a dicing blade, the wafer is diced. The dicing blade cuts the semiconductor layer 101 and the mold layer 106 at the same time. The side surfaces of the semiconductor layer 101 and side surfaces of the mold layer 106 are thereby made flush. That is, the side surfaces of the semiconductor layer 101 and the side surfaces of the mold layer 106 are constituted of ground surfaces that are continuous to each other. Consequently, the semiconductor device 100 such as shown in FIG. 2 is obtained.

The second electrode layer 103 may be formed at the second main surface 101*b* of the semiconductor layer 101 at the step shown in FIG. 5A. A lower surface of the second electrode layer 103, the upper surfaces of the plating layers 105, the side surfaces of the plating layers 105, and the upper surfaces of the mold layer 106 constitute outer surface of the semiconductor device 100 (chip).

Figure 6:
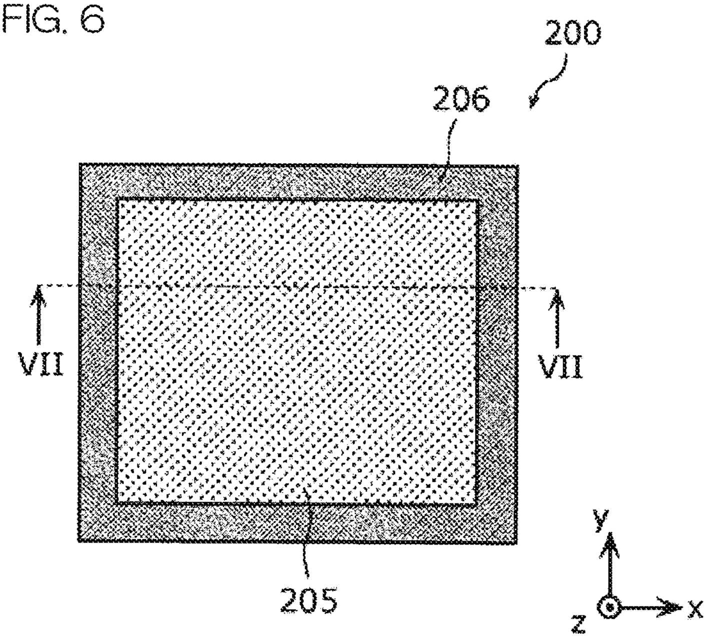
FIG. 6 is a plan view of a semiconductor device according to a second preferred embodiment.
Figure 7:
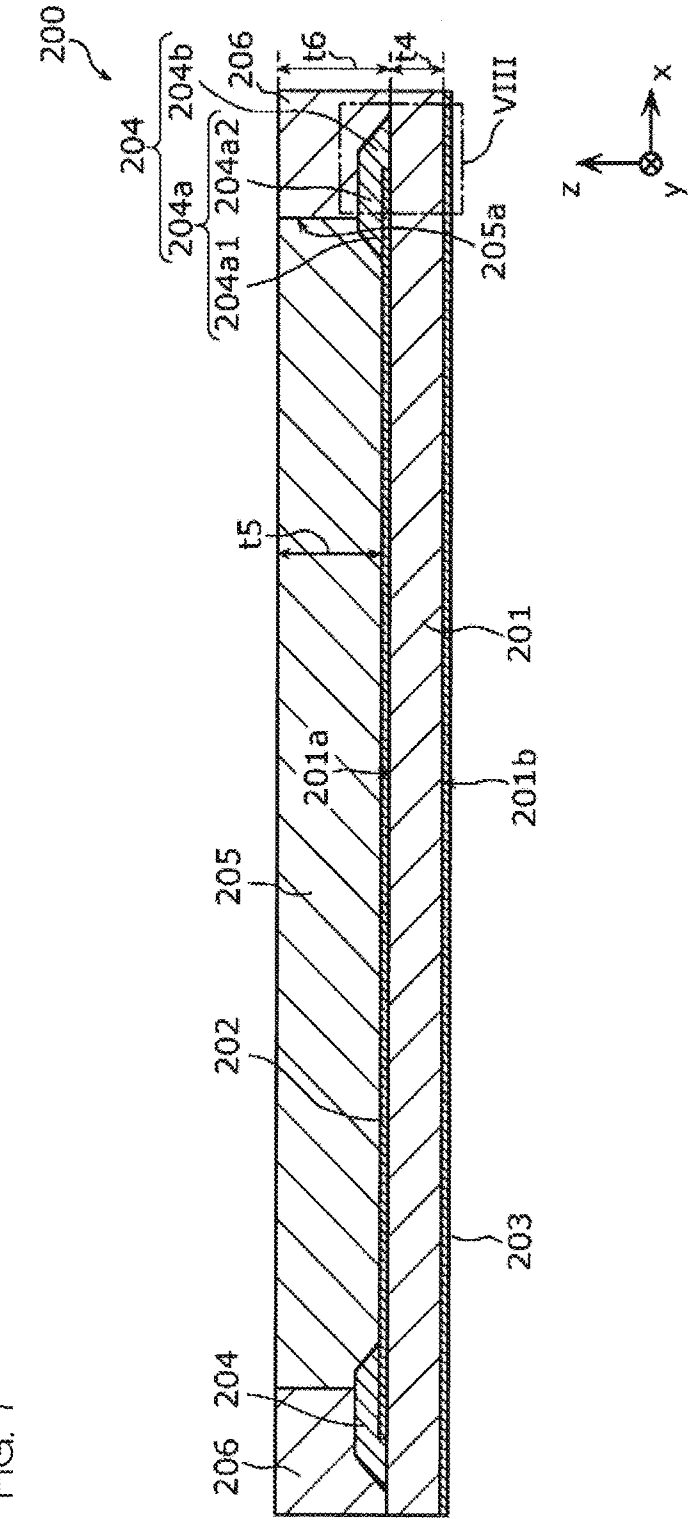
FIG. 7 is a sectional view of the semiconductor device shown in FIG. 6.

Next, the arrangement of a semiconductor device according to a second preferred embodiment shall be described. FIG. 6 is a plan view of the semiconductor device according to the second preferred embodiment. FIG. 7 is a sectional view (sectional view taken along line VII-VII of FIG. 6) of the semiconductor device shown in FIG. 6.

The semiconductor device 200 shown in FIG. 6 is a semiconductor chip that uses a Schottky barrier formed by junction of a semiconductor layer 201 and a first electrode layer 202 to function as a Schottky barrier diode of a vertical type. The semiconductor device 200 is, for example, a power semiconductor device that is used for supply and control of electric power. The semiconductor device 200 specifically includes a semiconductor layer 201, a first electrode layer 202, a second electrode layer 203, an insulating film 204, a plating layer 205, and a mold layer 206.

The semiconductor layer 201 is an SiC semiconductor layer that includes an SiC (silicon carbide) monocrystal as an example of a wide bandgap semiconductor. With the semiconductor device 200, an entirety of the semiconductor layer 201 corresponds to a semiconductor substrate (for example, the semiconductor substrate 101*c*). A conductivity type of the semiconductor layer 201 is, for example, the n-type. The semiconductor layer 201 is formed to a plate shape with a plan view shape being rectangular. Although a length of a side of the semiconductor layer 201 is not less than 1 mm and not more than 10 mm, it may be not less than 2 mm and not more than 5 mm.

The semiconductor layer 201 has a first main surface 201*a* and a second main surface 201*b* that is opposed to the first main surface 201*a*. A thickness t4 of the semiconductor layer 201 (semiconductor substrate) is, for example, not less than 100 μm and not more than 350 μm. It is preferred that the thickness t4 of the semiconductor layer 201 is not more than 200 μm. The semiconductor layer 201 is not limited to an SiC semiconductor layer and may be a semiconductor layer constituted of another wide bandgap semiconductor such as GaN, etc., or may be an Si semiconductor layer. Obviously, the semiconductor layer 201 may have a laminated structure that includes the semiconductor substrate 101*c* described above and the epitaxial layer 101*d* described above.

The first electrode layer 202 is formed on the first main surface 201*a*. The first electrode layer 202 functions as an anode of the Schottky barrier diode. The first electrode layer 202 is formed, for example, of aluminum. The first electrode layer 202 may be formed of another material such as titanium, nickel, copper, silver, gold, titanium nitride, tungsten, etc.

The second electrode layer 203 is formed on the second main surface 201*b*. The second electrode layer 203 functions as a cathode of the Schottky barrier diode. The second electrode layer 203 is formed, for example, of a laminated film of titanium, nickel, and gold. The second electrode layer 203 may be formed of another material such as aluminum, copper, silver, titanium nitride, tungsten, etc.

The insulating film 204 covers an entire perimeter of outer peripheral portions (for example, each of both end portions in an x-axis direction and both end portions in an y-axis direction) of the first electrode layer 202. The insulating film 204 includes a first portion 204*a* and a second portion 204*b*. The first portion 204*a* overlaps on the first electrode layer 202. In more detail, the first portion 204*a* overlaps on peripheral edge portions of the first electrode layer 202. The second portion 204*b* is positioned at outer sides of the first portion 204*a* and covers regions other than the first electrode layer 202. That is, the second portion 204*b* does not ride on the first electrode layer 202.

The first portion 204*a* further includes an inner end portion 204*a*1 and a flat portion 204*a*2. The inner end portion 204*a*1 is an end portion of a portion of the first portion 204*a* that is positioned at inner sides of the semiconductor layer 201 in plan view. The inner end portion 204*a*1 is inclined obliquely downward toward inner portions of the first electrode layer 202 in sectional view. The flat portion 104*a*2 is positioned at outer sides of the inner end portion 204*a*1 (the peripheral edge side of the semiconductor layer 101) and has a substantially uniform thickness.

The insulating film 204 is, for example, an organic film that includes a photosensitive resin. The insulating film 204 is formed, for example, of a polyimide, a PBO (polybenzoxazole), etc. The insulating film 204 may be an inorganic film that is formed of silicon nitride, silicon oxide, etc. The insulating film 204 may have a single layer structure or may have a laminated structure in which a plurality of types of materials are laminated. If the insulating film 204 has a laminated structure, the insulating film 204 may include both an organic film and an inorganic film. In this case, the insulating film 204 preferably includes an inorganic film and an organic film that are laminated in that order from the first main surface 201*a* side. A thickness of the insulating film 204 is approximately 10 μm at the maximum.

The plating layer 205 is a metal layer that covers at least a portion of the first electrode layer 202. The plating layer 205 covers at least a portion of the first electrode layer 202 other than the end portions (that is, the portions covered by the insulating film 204). As shown in FIG. 6, the plating layer 205 is surrounded by the mold layer 206 in plan view. The plating layer 205 that is formed on the first electrode layer 202 functions as a pad with a plan view shape being rectangular. A pad is a portion to which a bonding wire is bonded when the semiconductor device 200 is packaged. Also, the plating layer 205 functions as a supporting member of the mold layer 206 as well.

The plating layer 205 is, for example, formed of a material differing from the first electrode layer 202. The plating layer 205 is formed, for example, of copper or a copper alloy having copper as a main component. The plating layer 205 may be formed of another metal material. A thickness t5 of the plating layer 205 is greater than the thickness of the insulating film 204. In more detail, the thickness t5 of the plating layer 205 is greater than the maximum thickness of the insulating film 204 positioned on the first electrode layer 202. A topmost portion of the plating layer 205 is thereby higher than a topmost portion of the insulating film 204. The thickness t5 of the plating layer 205 is, for example, not less than 30 μm and not more than 100 μm. The thickness t5 of the plating layer 205 may be not less than 100 μm and not more than 200 μm.

Side surfaces 205*a* of the plating layer 205 extend vertically or substantially vertically. The side surfaces 205*a* do not necessarily have to extend rectilinearly in sectional view and can include a curve or unevenness. The side surfaces 205*a* are positioned in regions in which both the first electrode layer 202 and the insulating film 204 overlap mutually. In more detail, the side surfaces 205*a* are positioned on the flat portion 204*a*2 of the insulating film 204. That is, the plating layer 205 covers the inner end portion 204*a*1 and the flat portion 204*a*2 of the first portion 204*a*. By the side surfaces 205*a* being positioned on the flat portion 204*a*2, the plating layer 205 can be formed with stability in comparison to a case where the side surfaces 205*a* are positioned on the inner end portion 204*a*1 that is comparatively large in variation in thickness.

The mold layer 206 is a resin layer that covers a portion of the insulating film 204. In this embodiment, the mold layer 206 also covers a portion of the first main surface 201*a*. The mold layer 206 is positioned at outer peripheral portions at the first main surface 201*a* side of the semiconductor layer 201. In plan view, the mold layer 206 has a rectangular annular shape oriented along the outer peripheral portions of the semiconductor layer 201. Inner side surfaces of the mold layer 206 are in direct contact with the side surfaces 205*a* of the plating layer 205. The mold layer 206 is formed just on the first main surface 201*a* of the semiconductor layer 201 and exposes the second main surface 201*b* and side surfaces of the semiconductor layer 201.

The mold layer 206 is formed, for example, of a thermosetting resin (epoxy resin). The mold layer 106 may be formed of an epoxy resin that includes carbon and glass fibers, etc. Although a thickness t6 of the mold layer 206 is, for example, not less than 30 μm and not more than 100 μm, it may be not less than 100 μm and not more than 200 μm. An upper surface of the mold layer 206 and an upper surface of the plating layer 205 are flush or substantially flush.

Figure 8:
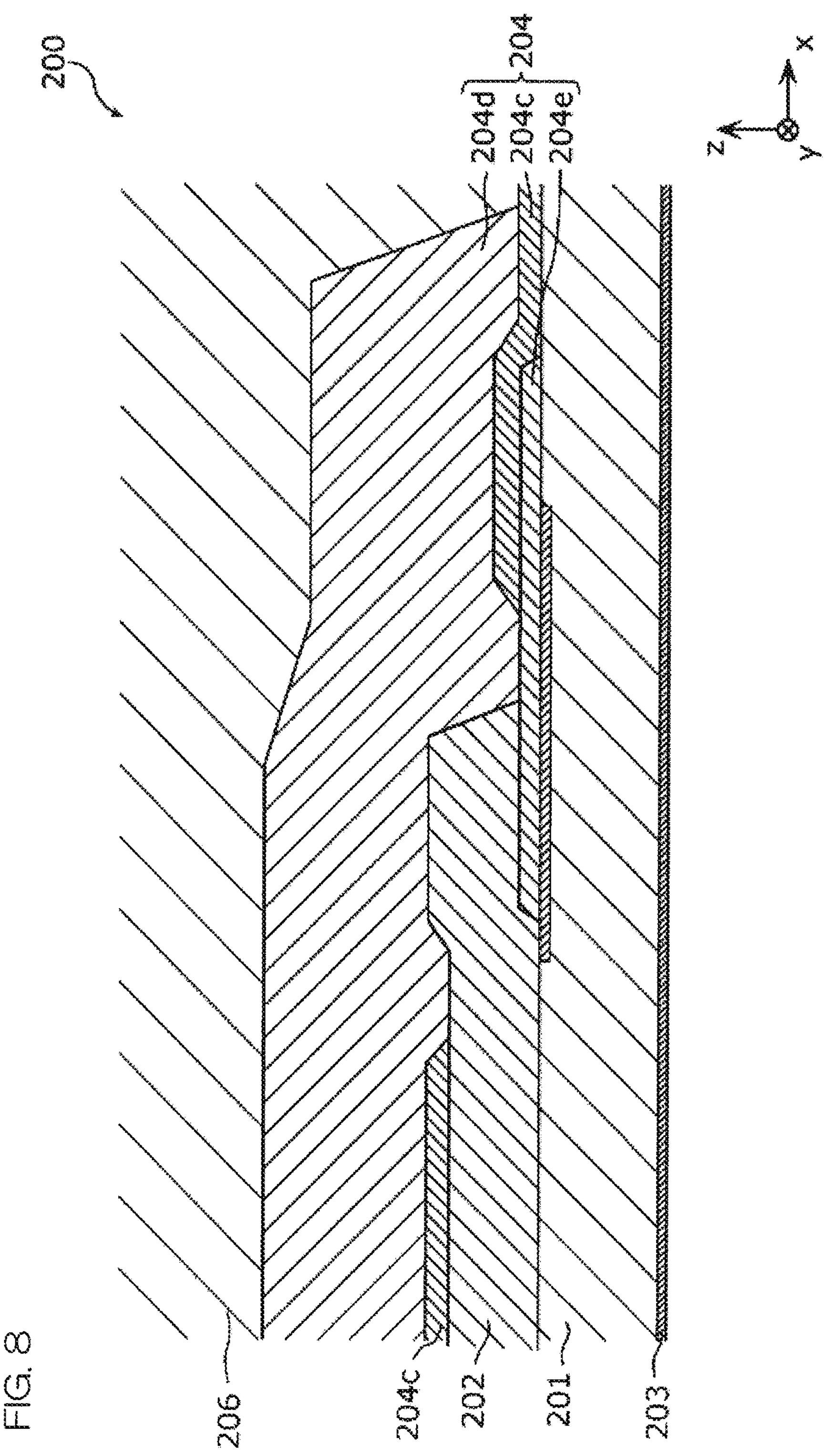
FIG. 8 is a diagram of the detailed arrangement of an outer peripheral portion of the semiconductor device shown in FIG. 6.

Next, the detailed arrangement of an outer peripheral portion (in other words, an end portion) of the semiconductor device 200 shall be described. FIG. 8 is a diagram of the detailed arrangement of the outer peripheral portion of the semiconductor device 200 (sectional view showing details of a region VIII of FIG. 7).

The end portions of the first electrode layer 202 are covered by the insulating film 204. Specifically, the insulating film 204 includes a first insulating film 204*c* positioned on the first electrode layer 202, a second insulating film 204*d* positioned on the first insulating film 204*c*, and a third insulating film 204*e* positioned below the first electrode layer 202. In more detail, the third insulating film 204*e* is positioned between the first electrode layer 202 and the semiconductor layer 201. The first insulating film 204*c* is an inorganic film formed of silicon nitride, silicon oxide, etc. The second insulating film 204*d* is an organic film formed of a polyimide, a PBO, etc. The third insulating film 204*e* is an inorganic film formed of silicon nitride, silicon oxide, etc.

In a general semiconductor device, such an insulating film 204 is arranged to suppress entry of moisture into the end portions of the first electrode layer 202, occurrence of ion migration, etc. However, when a durability test under an environment of high temperature and humidity or a reliability test such as a temperature cycle test, etc., is performed, there is a possibility for the insulating film 204 to degrade to cause moisture to enter from a degraded location or ion migration to occur at the degraded location, etc. That is, degradation of the insulating film 204 may become a cause of malfunction of the semiconductor device.

Thus, with the semiconductor device 200, the insulating film 204 is further covered by the mold layer 206. Thereby, the degradation of the insulating film 204 is suppressed and reliability of the semiconductor device 200 is improved. As shown in FIG. 8, an endmost portion of the first electrode layer 202 is covered by the second insulating film 204*d* and the first insulating film 204*c* is omitted. Stress is relaxed by such a structure. A method for manufacturing the semiconductor device 200 is similar to the method for manufacturing the semiconductor device 100 and therefore, a detailed description of the method for manufacturing the semiconductor device 200 shall be omitted.

Figure 9:
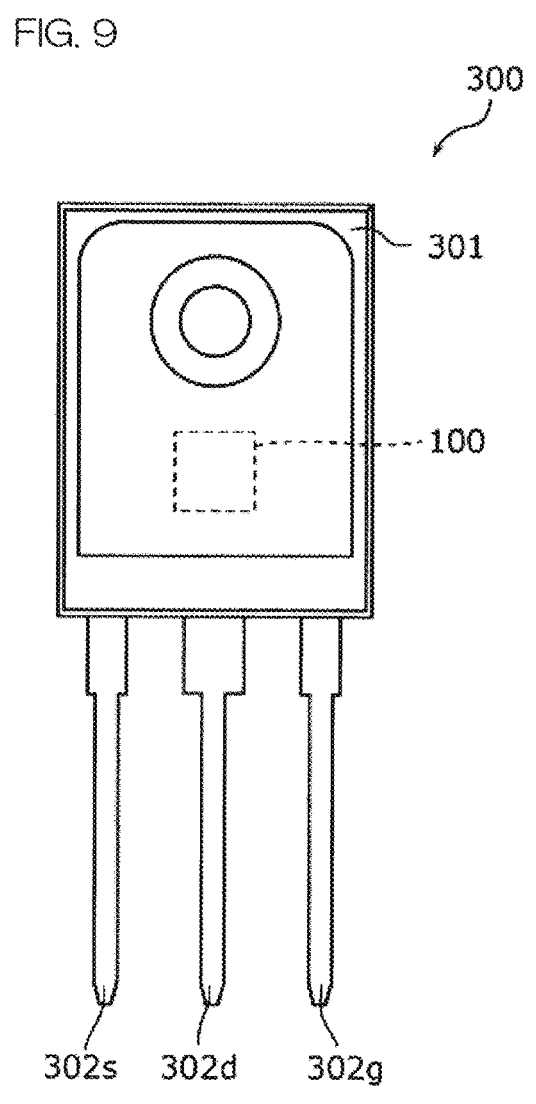
Figure 10:
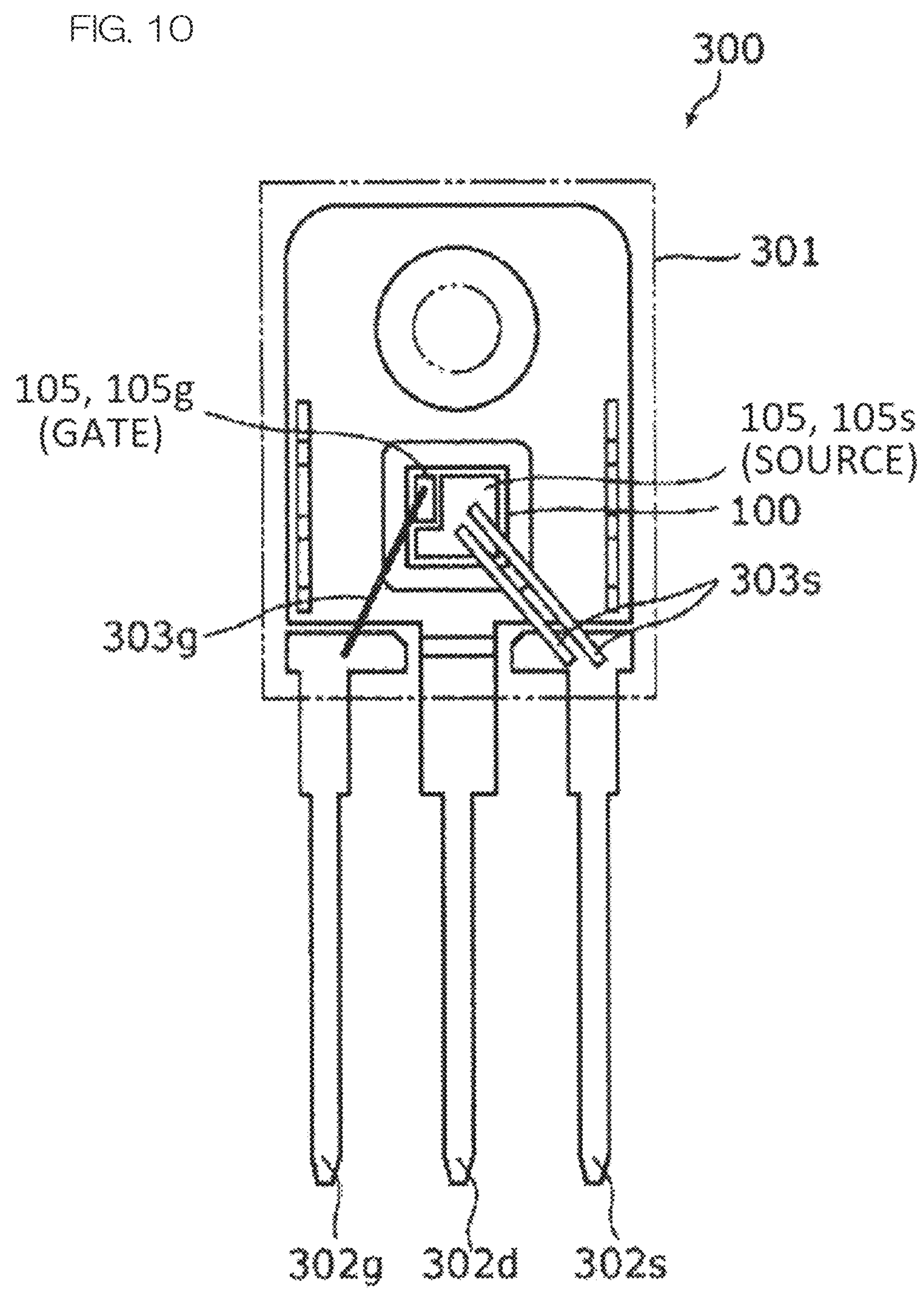
FIG. 10 is a diagram of the example of the semiconductor package shown in FIG. 9.

With a third preferred embodiment, a semiconductor package that has a semiconductor device shall be described. FIG. 9 and FIG. 10 are diagrams of an example of the semiconductor package according to the third preferred embodiment. FIG. 10 is a diagram of the internal structure of the semiconductor package 300 shown in FIG. 9 as viewed from an opposite side to that of FIG. 9.

The semiconductor package 300 is a semiconductor package of a so-called TO (transistor outline) type. The semiconductor package 300 includes a package main body 301, a terminal 302*d*, a terminal 302*g*, a terminal 302*s*, a bonding wire 303*g*, bonding wires 303*s*, and the semiconductor device 100.

The package main body 301 is of a rectangular parallelepiped shape and the terminal 302*d*, the terminal 302*g*, and the terminal 302*s* project from a bottom portion of the package main body 301. Also, the package main body 301 incorporates the semiconductor device 100. The package main body 301 is, in other words, a sealing body that seals the semiconductor device 100. The package main body 301 is formed, for example, of an epoxy resin. The package main body 301 may be formed of an epoxy resin that includes carbon and glass fibers, etc.

The terminal 302*d*, the terminal 302*g*, and the terminal 302*s* respectively project from the bottom portion of the package main body 301 and are arranged in a single column. The terminal 302*d*, the terminal 302*g*, and the terminal 302*s* are respectively formed, for example, of aluminum. The terminal 302*d*, the terminal 302*g*, and the terminal 302*s* may respectively be formed of another metal material such as copper, etc., instead.

In an interior of the package main body 301, the gate pad (plating layer 105*g* on the first electrode layer 102*g*) included in the semiconductor device 100 is electrically connected to the terminal 302*g* by the bonding wire 303*g*. The source pad (plating layer 105*s* on the first electrode layer 102*s*) included in the semiconductor device 100 is electrically connected to the terminal 302*s* by the bonding wires 303*s*. The drain electrode (second electrode layer 103) included in the semiconductor device 100 is bonded by solder or a sintered layer constituted of silver or copper, etc., to a wide portion of the terminal 302*d* that is positioned inside the package main body 301.

The semiconductor package 300 may include the semiconductor device 200 in place of the semiconductor device 100. In this case, the semiconductor package 300 includes two terminals and in the interior of the package main body 301, the anode (first electrode layer 202) included in the semiconductor device 200 is electrically connected by a bonding wire, etc., to one of the two terminals and the cathode (second electrode layer 203) is bonded by solder or a sintered layer constituted of silver or copper, etc., to a wide portion of the other of the two terminals that is positioned inside the package main body 401.

Due to including the semiconductor device 100 (or the semiconductor device 200), the semiconductor package 300 such as described above has a higher reliability than in a case where a general semiconductor device is included.

Figure 11:
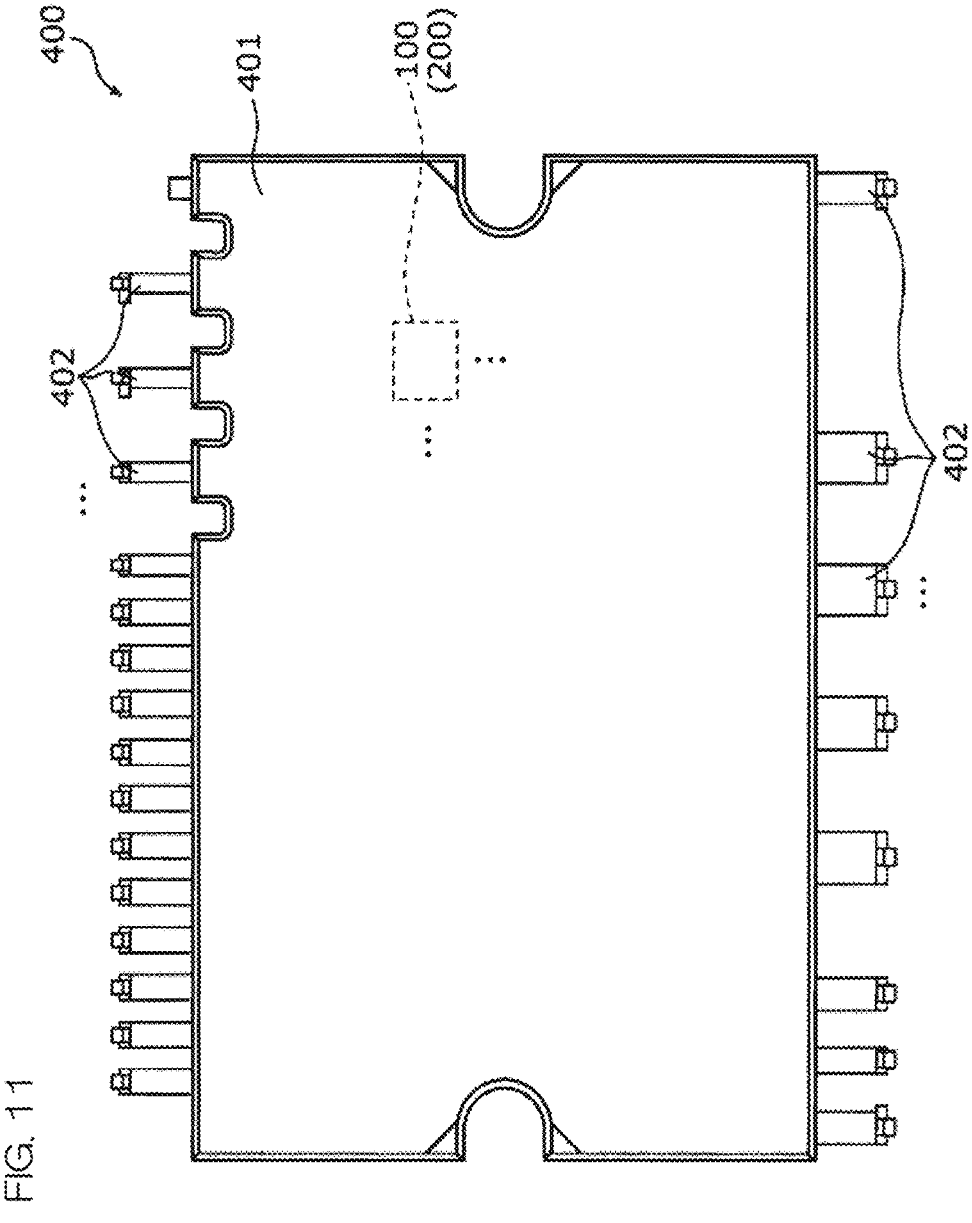
FIG. 11 is a diagram of another example of a semiconductor package according to the third preferred embodiment.

Next, another example of a semiconductor package according to the third preferred embodiment shall be described. FIG. 11 is a diagram of the other example of the semiconductor package according to the third preferred embodiment. The semiconductor package 400 shown in FIG. 11 is a semiconductor package of a so-called DIP (dual in-line package) type. The semiconductor package 400 includes a package main body 401, a plurality of terminals 402, and the semiconductor device 100.

The package main body 401 is of a rectangular parallelepiped shape and the plurality of terminals 402 project from the package main body 401. Also, the package main body 401 incorporates the semiconductor device 100. The package main body 401 is, in other words, a sealing body that seals the semiconductor device 100. The package main body 401 is formed, for example, of an epoxy resin that includes carbon and glass fibers, etc.

The plurality of terminals 402 are juxtaposed along long sides of the package main body 401. The plurality of terminals 402 are respectively formed, for example, of aluminum. The plurality of terminals 402 may respectively be formed of another metal material such as copper, etc., instead.

In an interior of the package main body 401, the gate pad (plating layer 105*g* on the first electrode layer 102*g*), the source pad (plating layer 105*s* on the first electrode layer 102*s*), and the drain electrode (second electrode layer 103) included in the semiconductor device 100 are each electrically connected by a bonding wire, etc., to a corresponding terminal 402. The semiconductor package 400 may include a plurality of semiconductor devices 100. That is, the package main body 401 may incorporate a plurality of semiconductor devices 100.

Also, the semiconductor package 400 may include the semiconductor device 200 in place of or in addition to the semiconductor device 100. In this case, in the interior of the package main body 401, the anode (first electrode layer 202) and the cathode (second electrode layer 203) included in the semiconductor device 200 are each electrically connected by a bonding wire, etc., to a corresponding terminal 402.

Due to including the semiconductor device 100 (or the semiconductor device 200), the semiconductor package 400 such as described above has a higher reliability than in a case where a general semiconductor device is included.

Figure 12:
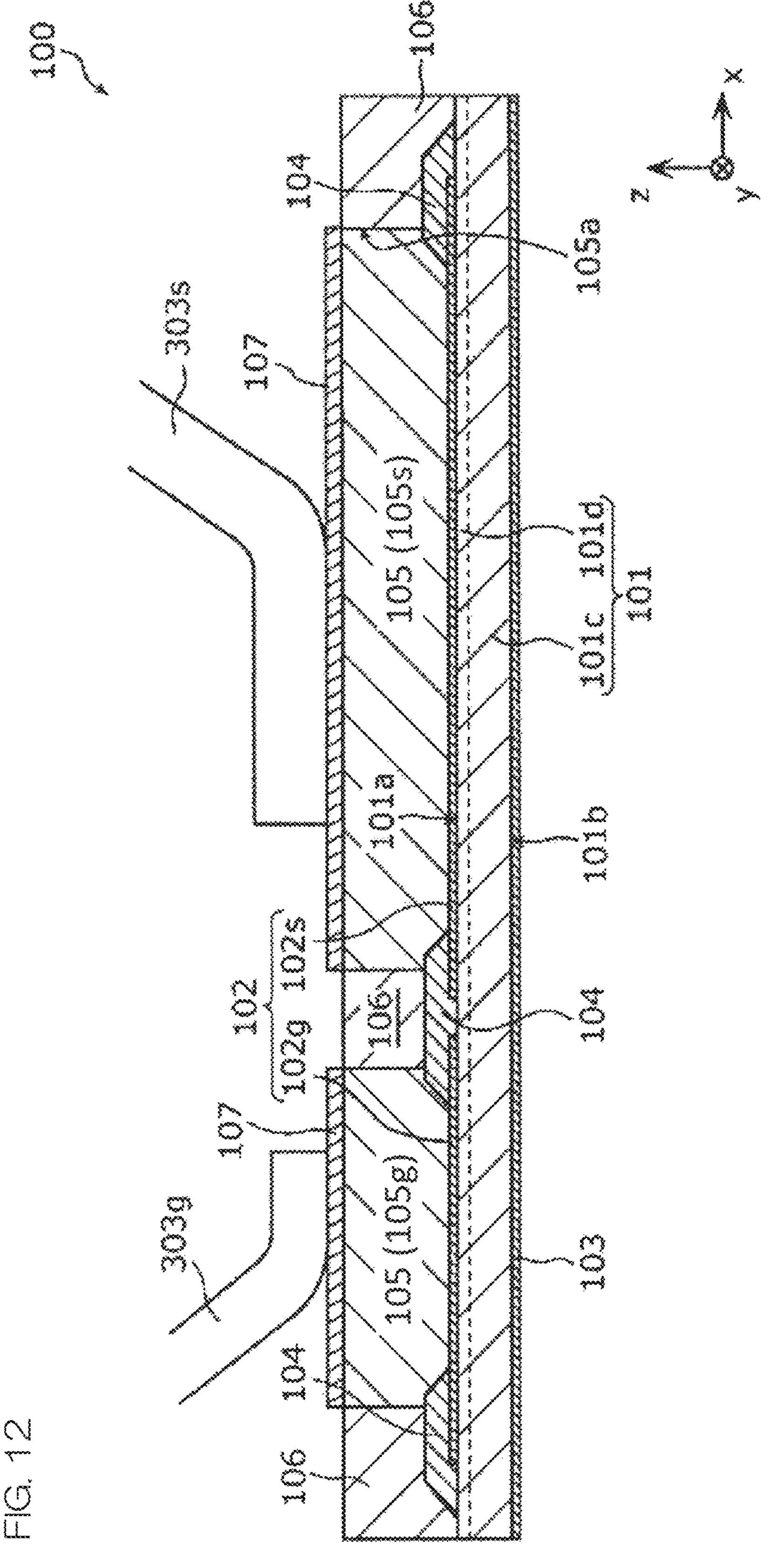
FIG. 12 is a sectional view of a semiconductor device having a structure in which nickel layers are formed on plating layers.

As described above, bonding wires are used for electrical connection of the terminals included in the semiconductor package 300 or the semiconductor package 400 and the semiconductor device 100 (or the semiconductor device 200). If the bonding wires are wires constituted of aluminum, it is preferable for nickel layers to be formed on the plating layers 105 as shown in FIG. 12. FIG. 12 is a sectional view of the semiconductor device 100 having a structure in which nickel layers are formed on the plating layers 105.

In FIG. 12, a bonding wire 303*g* and a bonding wire 303*s* are also illustrated together as an example of bonding wires. Nickel layers 107 are an example of metal layers that are formed of a metal material differing from the metal material forming the plating layers 105 (105*g*, 105*s*). Although not illustrated, a nickel layer may likewise be formed on the plating layer 205 in the semiconductor device 200 as well.

Figure 13:
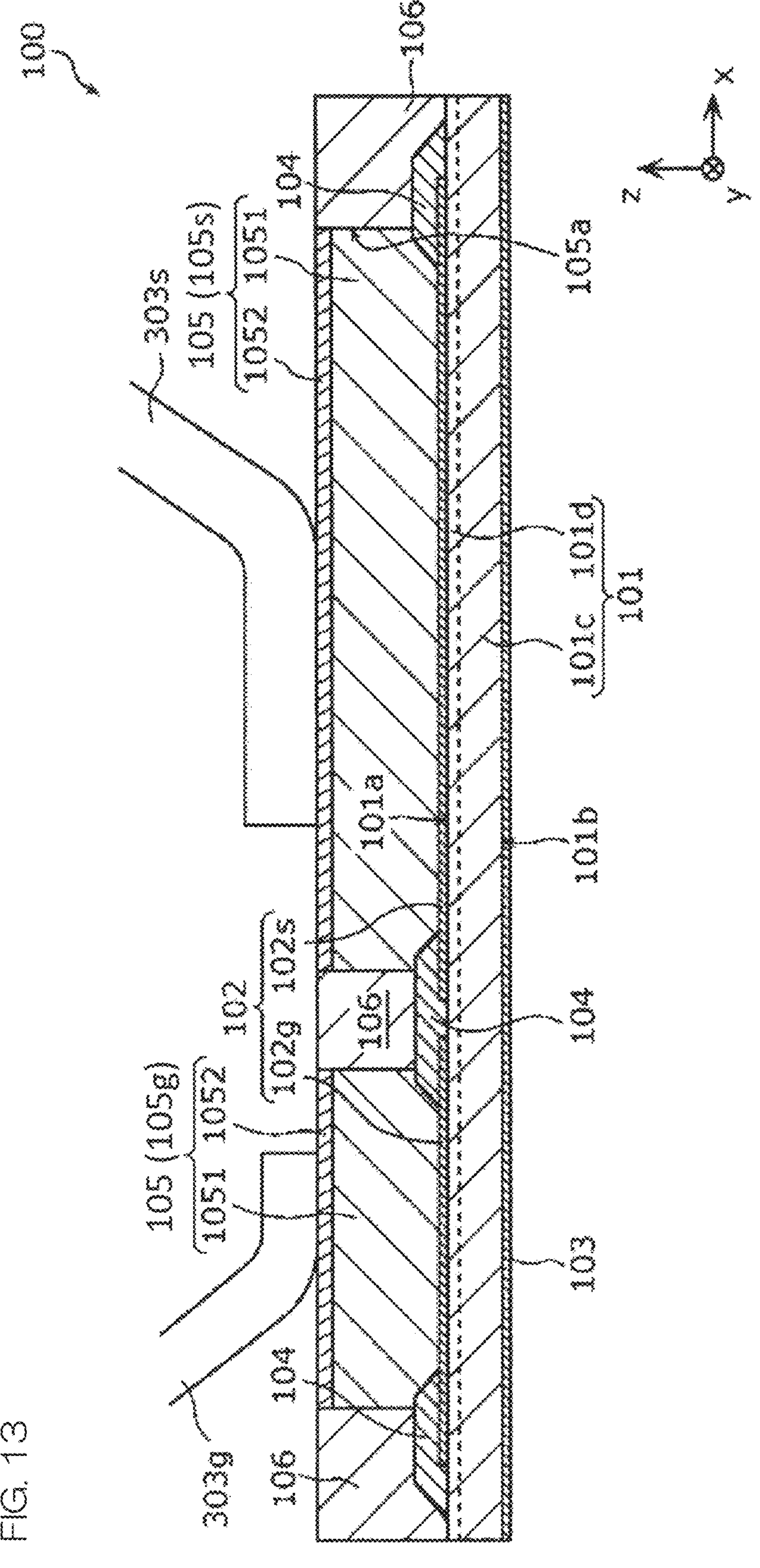
FIG. 13 is a sectional view of a semiconductor device that includes a plating layer with a two layer structure.

Also, as shown in FIG. 13, each plating layer 105 (105*g*, 105*s*) may be arranged from a first plating layer 1051 constituted of copper and a second plating layer 1052 constituted of nickel. FIG. 13 is a sectional view of the semiconductor device 100 that includes a plating layer with a two layer structure. By this, the need to form additional nickel layers as in the example of FIG. 12 is eliminated. With the example of FIG. 13, upper surfaces of the second plating layers 1052 and the upper surface of the mold layer are flush.

Also, although with the examples of FIG. 12 and FIG. 13, nickel layers are formed on frontmost surfaces of the plating layers 105 that are portions of bonding with the bonding wires constituted of aluminum, other layer arrangements may be formed in place of the nickel layers on the frontmost surfaces of the plating layers 105. For example, the frontmost surface of each plating layer 105 may be of a two layer structure in which a palladium layer is formed on a nickel layer (that is, an NiPd layer).

Also, the frontmost surface of each plating layer 105 may be of a three layer structure in which another metal layer is formed further on the palladium layer (for example, an NiPdAu layer). Such an NiPd layer and NiPdAu layer are favorable not only in a case where a bonding wire is bonded to the plating layer 105 that functions as the source pad but also in a case where an external terminal is bonded by silver sintered to the plating layer 105 that functions as the source pad.

The form of a semiconductor package that includes the semiconductor device 100 (or the semiconductor device 200) is not limited to a form such as the semiconductor package 300 and the semiconductor package 400. As the semiconductor package, an SOP (small outline package), a QFN (quad flat non-lead package), a DFP (dual flat package), a QFP (quad flat package), an SIP (single inline package), or an SOJ (small outline J-leaded package) may be adopted. Also, any of various semiconductor packages related to these may be applied as the semiconductor package.

As described above, the semiconductor device 100 includes the semiconductor layer 101, the first electrode layer 102, the second electrode layer 103, the plating layers 105, and the mold layer 106. The semiconductor layer 101 has the first main surface 101*a* and the second main surface 101*b* that is opposed to the first main surface 101*a*. The first electrode layer 102 is formed on the first main surface 101*a*. The second electrode layer 103 is formed on the second main surface 101*b*. The insulating film 104 covers the end portions of the first electrode layer 102. The plating layers 105 cover at least portions of the first electrode layer 102 other than the end portions. The mold layer 106 covers the insulating film 104.

With the semiconductor device 100, the degradation of the insulating film 104 can be suppressed because the insulating film 104 that covers the end portions of the first electrode layer 102 is further covered by the mold layer 106. That is, the semiconductor device 100 can be said to be a semiconductor device that is improved in reliability.

The mold layer 106 is, for example, of an annular shape that is oriented along the outer peripheral portions of the semiconductor layer 101 in plan view. Such a semiconductor device 100 is further improved in reliability by the outer peripheral portions of the semiconductor layer 101 being covered by the mold layer 106. Front surfaces of the plating layers 105 and a front surface of the mold layer 106 are, for example, flush. Such a semiconductor device 100 can be manufactured by coating or printing the resin material 106*a* on the first main surface 101*a* side of the semiconductor layer 101 and thereafter grinding until the plating layers 105 are exposed.

The plating layers 105 and the mold layer 106 are, for example, in direct contact. With such a semiconductor device 100, the plating layers 105 can be used as supporting bodies of the mold layer 106. The semiconductor layer 101 is, for example, formed of an SiC. With such a semiconductor device 100, a comparatively high dielectric breakdown field strength can be obtained.

The semiconductor device 100 may function, for example, as a transistor. In this case, the second electrode layer 103 may be a drain electrode of the transistor. In this case, the first electrode layer 102 may include a source electrode of the transistor and a gate electrode of the transistor. In the first electrode layer 102, the gate electrode is insulated from the source electrode. Such a semiconductor device 100 can function as a transistor.

The semiconductor device 200 functions, for example, as a Schottky barrier diode with the first electrode layer 202 being an anode and the second electrode layer 203 being a cathode. Such a semiconductor device 100 can function as a Schottky barrier diode. For example, the side wall of the semiconductor layer 101 and the side wall of the mold layer 106 are formed in a flush. Such a semiconductor device 100 can be manufactured by cutting the semiconductor layer 101 and the mold layer 106 at the same time.

For example, the Nickel layer 107 formed of a metal material different from the metal material forming the plating layer 105 is formed on the surface of the plating layer 105. The Nickel layer 107 is an example of a metal layer. With such a semiconductor device 100, the bonding wires can be easily bonded by forming the Nickel layer 107 suitable for bonding the bonding wires on the surface of the plating layer 105.

A method for manufacturing the semiconductor device 100 includes first to fifth steps. In the first step, the first electrode layer 102 is formed at a first main surface 101*a* of the semiconductor layer 101. In the second step, the second electrode layer 103 is formed at the second main surface 101*b* that is opposed to the first main surface 101*a*. In the third step, the insulating film 104 that covers the end portions of the first electrode layer 102 is formed. In the fourth step, the plating layers 105 that cover at least portions of the first electrode layer 102 other than the end portions is formed. In the fifth step, the mold layer 106 that covers the insulating film 104 is formed. According to this manufacturing method, the semiconductor device 100 that is improved in reliability can be manufactured.

For example, the step (the fifth step) of forming the mold layer 106 that covers the insulating film 104 includes a step of forming the mold layer 106 that covers the plating layer 105, and a step of grinding the surface of the mold layer 106 such as to exposes the plating layer 105. According to this manufacturing method, the semiconductor device 100 can be manufactured by grinding the surface of the mold layer 106 until the plating layer 105 is exposed.

Figure 14:
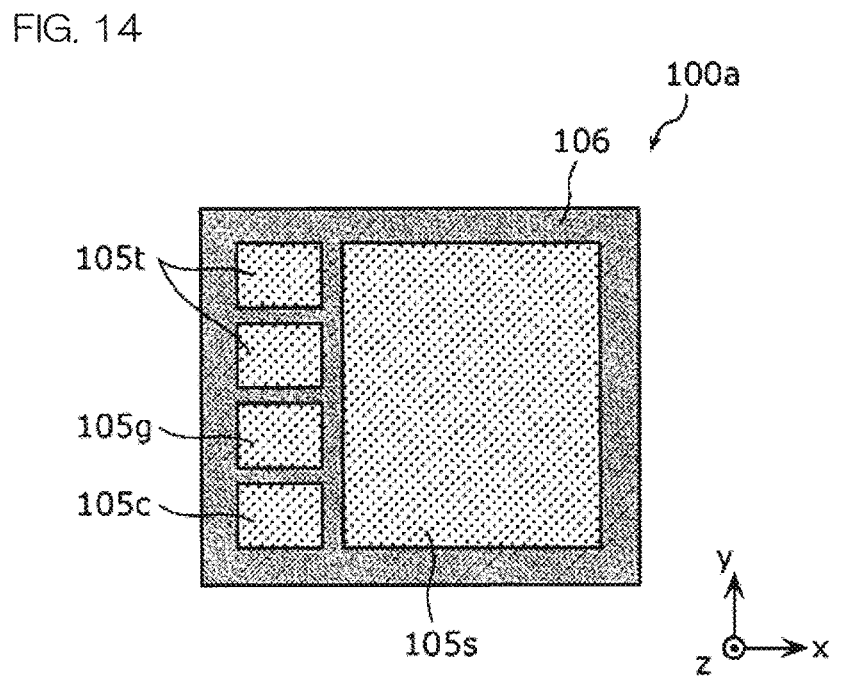

With a preferred embodiment described above, an example of the semiconductor device (semiconductor device 100) with which the plating layer 105*g* that functions as the gate pad and the plating layer 105*s* that functions as the source pad are arranged on the upper surface was described. Here, the semiconductor device may further include a plating layer 105 that functions as a pad for current sensing and a plating layer 105 that functions as a pad for temperature sensing. FIG. 14 is a plan view of a semiconductor device according to a modification example that has such a structure.

As shown in FIG. 14, the semiconductor device 100*a* includes, in addition to a gate pad 105*g* (the plating layer 105 that functions as the gate pad; the same applies hereinafter) and a source pad 105*s*, a current sensing pad 105*c* (pad electrode) and a pair of temperature sensing pads 105*t* (pad electrodes).

The semiconductor device 100*a* includes the first electrode layer 102*s* that has a plurality of separated portions that are mutually separated. The current sensing pad 105*c* is a plating layer that is connected to a portion (separated portion) with which a portion of the first electrode layer 102*s* included in the semiconductor device 100*a* is separated. When a current flows between the source pad 105*s* and the second electrode layer 103 that are respectively included in the semiconductor device 100*a*, a current that is smaller than the aforementioned current flows between the current sensing pad 105*c* and the second electrode layer 103. By monitoring such a current, increase in current can be detected.

The semiconductor device 100*a* includes a diode (temperature sensitive diode) that is arranged on the first main surface 101*a* of the semiconductor layer 101. One of the pair of temperature sensing pads 105*t* is a plating layer that is electrically connected to an anode of the diode (temperature sensing diode) included in the semiconductor device 100*a*. The other of the pair of temperature sensing pads 105*t* is a plating layer that is electrically connected to a cathode of the diode (temperature sensing diode). A temperature of the semiconductor device 100*a* can be detected from a magnitude of a voltage between the pair of temperature sensing pads 105*t*.

As described above, the present invention can also be realized as the semiconductor device 100*a* that includes the current sensing pad 105*c* and the pair of temperature sensing pads 105*t*. The present invention may be realized as a semiconductor device that includes at least one of either of the current sensing pad 105*c* and the pair of temperature sensing pads 105*t*.

Figure 15A:
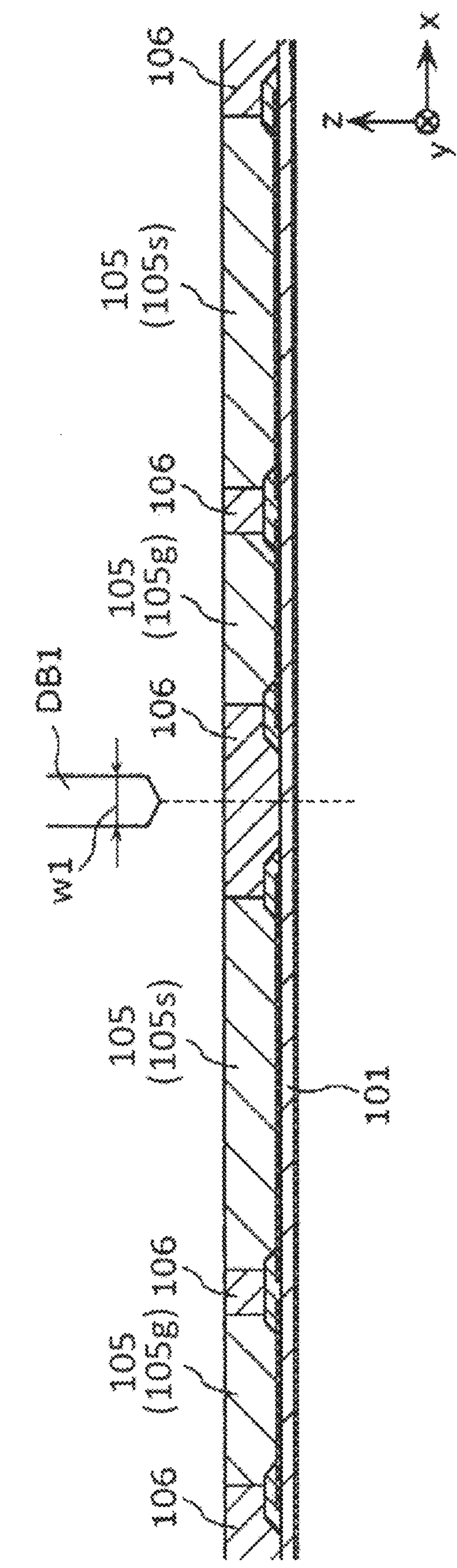
FIG. 15A is a first sectional view of dicing steps according to a modification example.
Figure 15B:
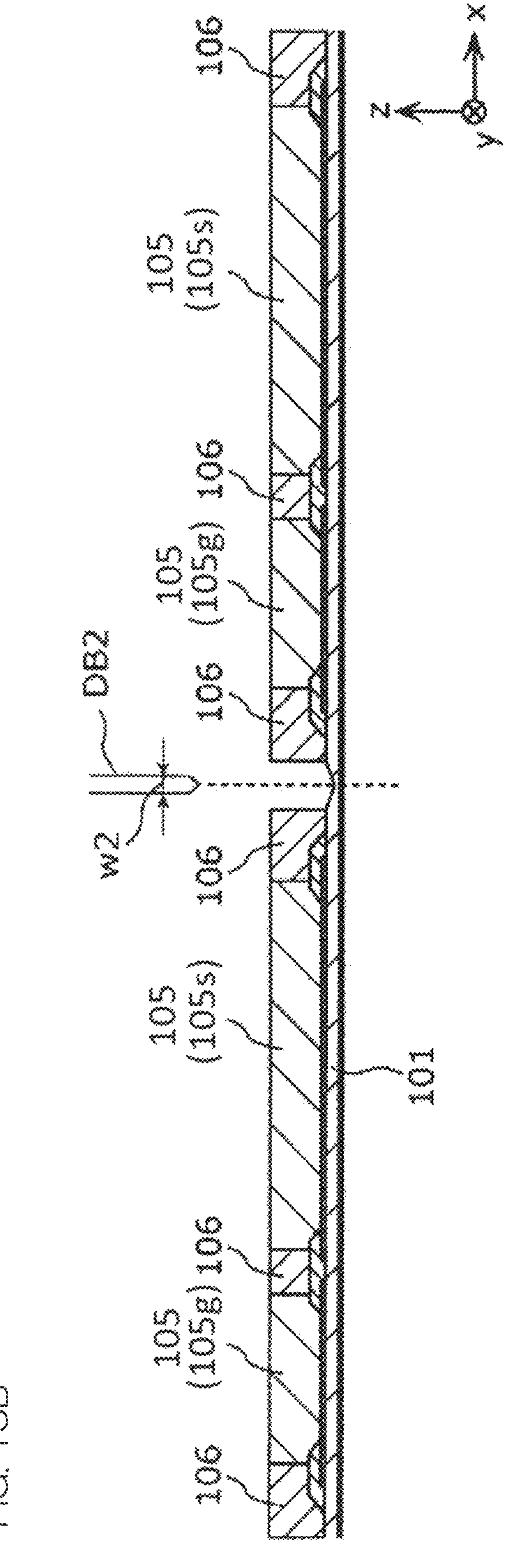
FIG. 15B is a second sectional view of the dicing steps according to the modification example.
Figure 15C:
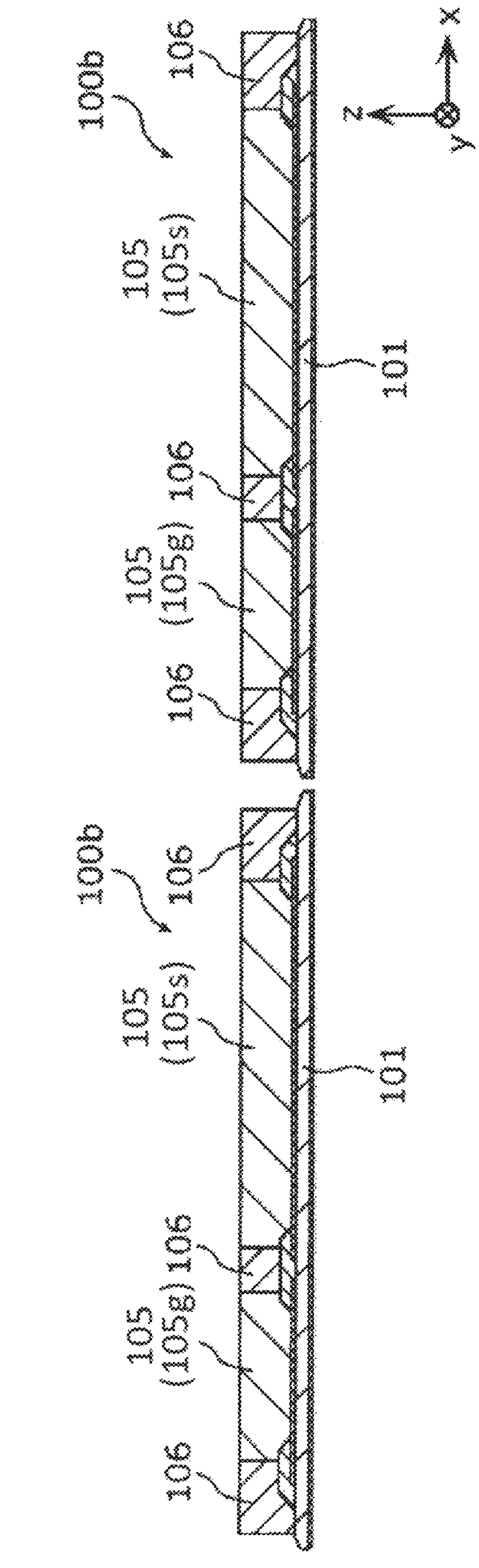
FIG. 15C is a third sectional view of the dicing steps according to the modification example.

Although with a preferred embodiment described above, an example where the mold layer 106 and the semiconductor layer 101 are cut at the same time by the dicing blade was described, the present invention is not limited thereto. For example, two stages of dicing steps may be combined. FIG. 15A to FIG. 15C are sectional views for describing dicing steps according to a modification example that has such dicing steps of two stages.

First, as shown in FIG. 15A, an entirety of the mold layer 106 and a portion of the semiconductor layer 101 are cut by a first dicing blade DB1 that has a first width w1. Thereafter, as shown in FIG. 15B, an entirety of the semiconductor substrate 101*c* is cut by a second dicing blade DB2 having the same rotational axis as the first dicing blade DB1 but having a second width w2 that is smaller than the first width w1. As shown in FIG. 15C, a semiconductor device 100*b* that is diced by this method is such that the side surfaces of the mold layer 106 are positioned further inward than the side surfaces of the semiconductor layer 101 and has a step in a vicinity of a boundary portion between the mold layer 106 and the semiconductor layer 101.

Figure 16A:
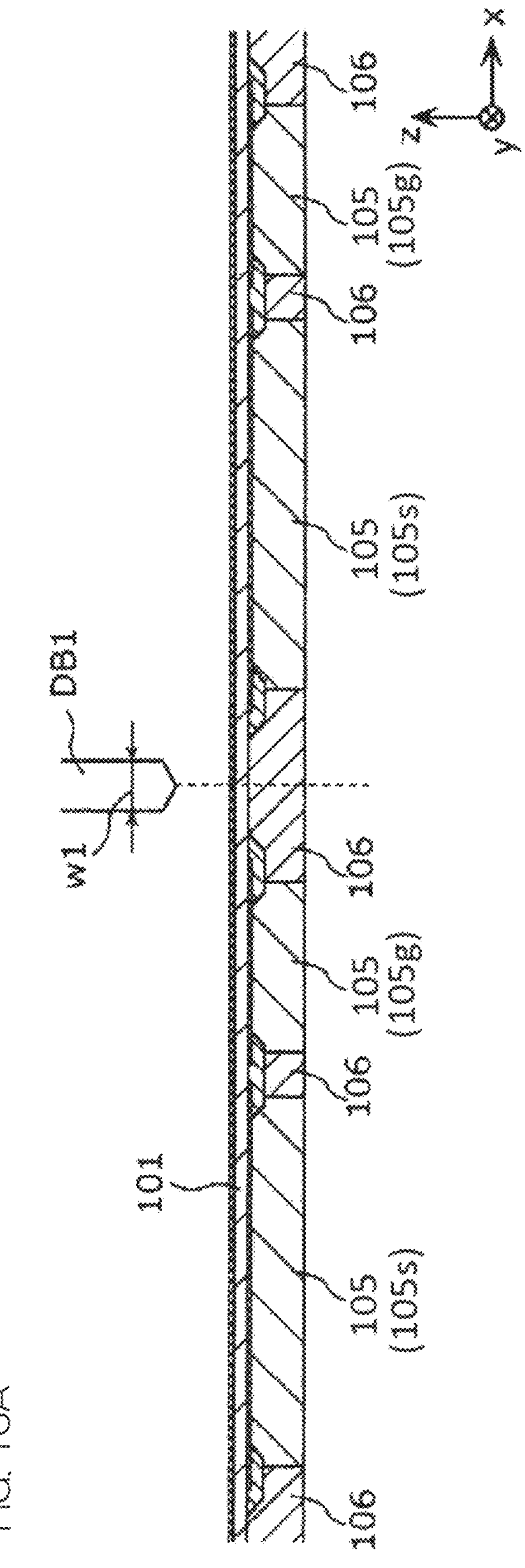
FIG. 16A is a first sectional view of dicing steps according to another modification example.
Figure 16B:
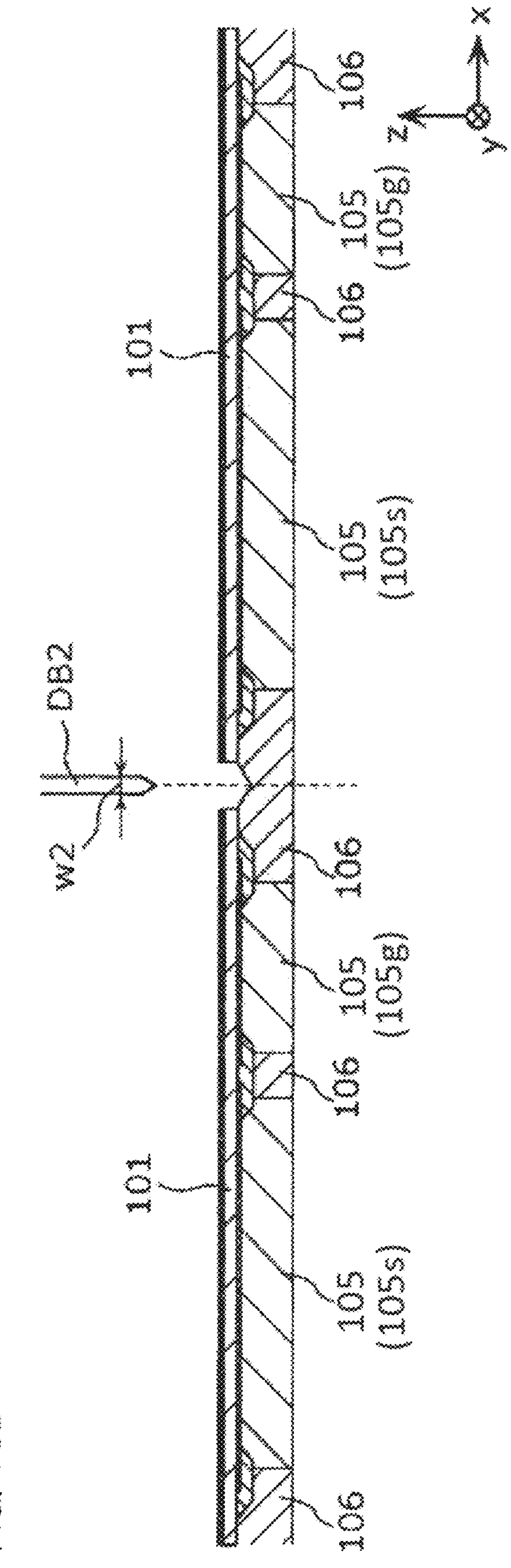
FIG. 16B is a second sectional view of the dicing steps according to the other modification example.
Figure 16C:
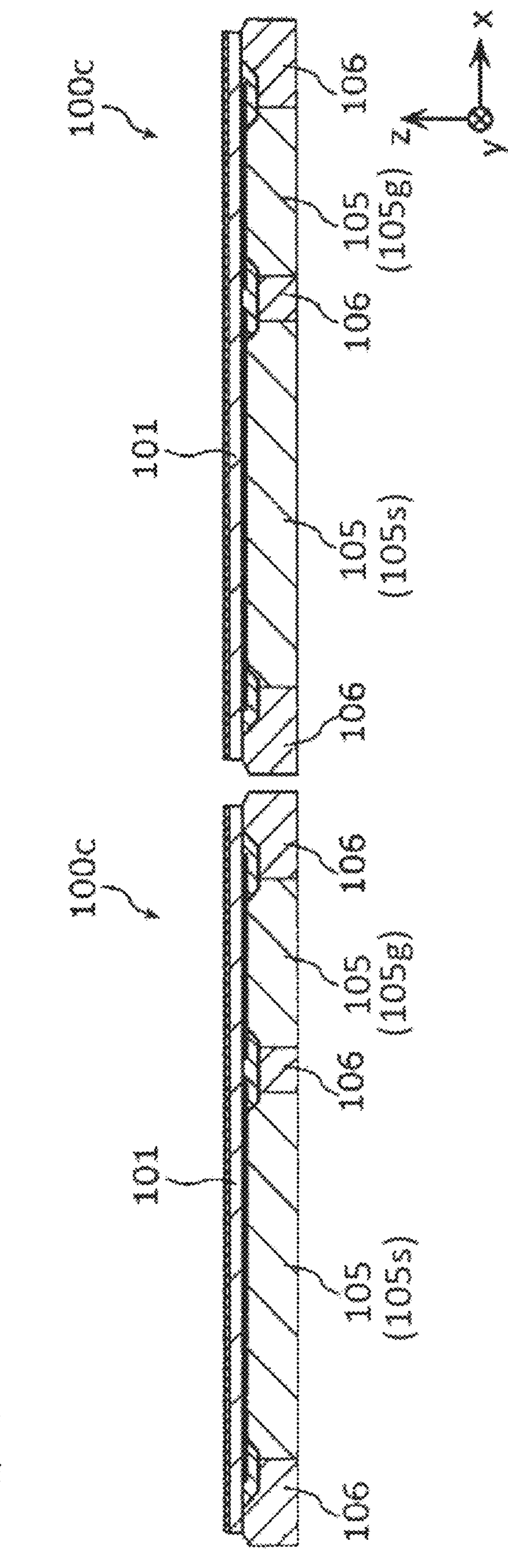
FIG. 16C is a third sectional view of the dicing steps according to the other modification example.

The dicing may be performed by inverting upper and lower sides of the wafer. That is, the dicing may be performed with a rear surface (carbon surface) of the semiconductor substrate 101*c* being at an upper side. A rotation direction of the dicing blade is preferably a direction with which cutting is performed from a carbon plane toward a silicon plane. FIG. 16A to FIG. 16C are sectional views for describing dicing steps according to another modification example that has such dicing steps of two stages.

First, as shown in FIG. 16A, an entirety of the semiconductor layer 101 and a portion of the mold layer 106 are cut by the dicing blade DB1 that has the first width w1. Thereafter, as shown in FIG. 16B, the entirety of the mold layer 106 is cut by the second dicing blade DB2 having the same rotational axis as the first dicing blade DB1 but having the second width w2 that is smaller than the first width w1. As shown in FIG. 16C, a semiconductor device 100*c* that is diced by this method is such that the side surfaces of the semiconductor layer 101 are positioned further inward than the side surfaces of the mold layer 106*c* and has a step in a vicinity of a boundary portion between the mold layer 106 and the semiconductor layer 101.

The dicing steps of two stages shown in FIG. 15A to FIG. 15C and the dicing steps of two stages shown in FIG. 16A to FIG. 16C are applicable not just to a semiconductor device that functions as a transistor but also to a semiconductor device that functions as a Schottky barrier diode.

Although the semiconductor devices according to the preferred embodiments have been described above, the present invention is not limited to the preferred embodiments described above. For example, the numerals used in the above description of the preferred embodiments are all indicated as examples for describing the present invention specifically and the present invention is not restricted by the numerals indicated as examples.

Also, although with the preferred embodiments described above, main materials of the constituent elements included in the semiconductor devices are indicated as examples, other materials may be included, within ranges enabling the realization of the same functions as the laminated structures of the preferred embodiments described above, in the respective layers of the laminated structures included in the semiconductor devices. Also, although in the drawings, corner portions and sides of the respective constituent elements are drawn rectilinearly, arrangements with which the corner portions and sides are rounded due to reasons of manufacture, etc., are also included in the present invention. Also, semiconductor devices having structures with which the conductivity types described in the preferred embodiments described above are inverted are included in the present invention as well.

Although semiconductor devices according to one or a plurality of modes have been described based on the preferred embodiments above, the present invention is not limited to these preferred embodiments. As long as the spirit and scope of the present invention is not departed from, embodiments in which various modifications that one skilled in the art can arrive at are applied to the preferred embodiments and embodiments constructed by combination of the constituent elements in different preferred embodiments are also included within the scope of the present invention.

Also, various modifications, replacements, additions, omissions, etc., can be performed within the scope of the claims or the scope of equivalents thereof on the respective preferred embodiments described above. For example, although with each of the preferred embodiments described above, a power semiconductor device using an SiC substrate was described, the present invention is also applicable to a power semiconductor device that uses an Si substrate (IGBT or MOSFET). In regard to industrial applicability, the present invention can be applied to semiconductor devices and semiconductor packages, etc.

Examples of features that are extracted from the present description and drawings are indicated below. Although alphanumeric characters within parenthesis in the following express corresponding constituent elements, etc., in the preferred embodiments described above, these are not meant to limit the scopes of the respective items to the preferred embodiments. Herein after, a semiconductor device that is improved in reliability is provided.

[A1] A semiconductor device (100, 100*a*, 100*b*, 100*c*, 200) including a semiconductor layer (100, 201) that has a first main surface (101*a*, 201*a*) and a second main surface (101*b*, 201*b*) that is opposed to the first main surface (101*a*, 201*a*), a first electrode layer (102, 102*g*, 102*s*, 202) that is formed at the first main surface (101*a*, 201*a*), a second electrode layer (103, 203) that is formed at the second main surface (101*b*, 201*b*), an insulating film (104, 204) that covers an end portion of the first electrode layer (102, 102*g*, 102*s*, 202), a plating layer (105, 205) that covers at least a portion other than the end portion of the first electrode layer (102, 102*g*, 102*s*, 202), and a mold layer (106, 206) that covers the insulating film (104, 204).

[A2] The semiconductor device (100, 100*a*, 100*b*, 100*c*, 200) according to A1, wherein the mold layer (106, 206) is of an annular shape that is oriented along an outer peripheral portion of the semiconductor layer (100, 201) in plan view.

[A3] The semiconductor device (100, 100*a*, 100*b*, 100*c*, 200) according to A1 or A2, wherein a front surface of the plating layer (105, 205) and a front surface of the mold layer (106, 206) are flush.

[A4] The semiconductor device (100, 100*a*, 100*b*, 100*c*, 200) according to any one of A1 to A3, where the plating layer (105, 205) and the mold layer (106, 206) are in direct contact.

[A5] The semiconductor device (100, 100*a*, 100*b*, 100*c*, 200) according to any one of A1 to A4, wherein the semiconductor layer (100, 201) is formed of an SiC.

[A6] The semiconductor device (100, 100*a*, 100*b*, 100*c*, 200) according to any one of A1 to A5, wherein the semiconductor device (100, 100*a*, 100*b*, 100*c*, 200) functions as a transistor, the second electrode layer (103, 203) is a drain electrode (40) of the transistor, and a source electrode (102*s*) of the transistor and a gate electrode (102*g*) of the transistor that is insulated from the source electrode (102*s*) are included in the first electrode layer (102, 102*g*, 102*s*, 202).

[A7] The semiconductor device (100, 100*a*, 100*b*, 100*c*, 200) according to any one of A1 to A6, wherein the semiconductor device (100, 100*a*, 100*b*, 100*c*, 200) functions as a Schottky barrier diode with the first electrode layer (102, 102*g*, 102*s*, 202) being an anode and the second electrode layer (103, 203) being a cathode.

[A8] The semiconductor device (100, 100*a*, 100*b*, 100*c*, 200) according to any one of A1 to A7, wherein a side surface of the semiconductor layer (100, 201) and a side surface of the mold layer (106, 206) are flush.

[A9] The semiconductor device (100, 100*a*, 100*b*, 100*c*, 200) according to any one of A1 to A8, wherein a metal layer formed of a metal material differing from a metal material that forms the plating layer (105, 205) is formed on the front surface of the plating layer (105, 205).

[A10] A method for manufacturing a semiconductor device (100, 100*a*, 100*b*, 100*c*, 200) including a step of forming a first electrode layer (102, 102*g*, 102*s*, 202) at a first main surface (101*a*, 201*a*) of a semiconductor layer (100, 201), a step of forming a second electrode layer (103, 203) on a second main surface (101*b*, 201*b*) of the semiconductor layer (100, 201) that is opposed to the first main surface (101*a*, 201*a*), a step of forming an insulating film (104, 204) that covers an end portion of the first electrode layer (102, 102*g*, 102*s*, 202), a step of forming a plating layer (105, 205) that covers at least a portion other than the end portion of the first electrode layer (102, 102*g*, 102*s*, 202), and a step of forming a mold layer (106, 206) that covers the insulating film (104, 204).

[A11] The method for manufacturing a semiconductor device (100, 100*a*, 100*b*, 100*c*, 200) according to A10, wherein the step of forming the mold layer (106, 206) that covers the insulating film (104, 204) includes a step of forming the mold layer (106, 206) such as to cover the plating layer (105, 205) and a step of grinding a front surface of the mold layer (106, 206) such that the plating layer (105, 205) is exposed.

[B1] A semiconductor device (100, 100*a*, 100*b*, 100*c*, 200) comprising, a semiconductor layer (101, 201) that has a main surface (101*a*, 201*a*), a main surface electrode (102, 102*g*, 102*s*, 202) that is arranged at the main surface (101*a*, 201*a*), an insulating film (104, 204) that partially covers the main surface electrode (102, 102*g*, 102*s*, 202) such as to expose a portion of the main surface electrode (102, 102*g*, 102*s*, 202), a mold layer (106, 206) that covers the insulating film (104, 204) such as to expose the main surface electrode (102, 102*g*, 102*s*, 202), and a pad electrode (105, 105*c*, 105*g*, 105*s*, 105*t*, 205) that is arranged at the main surface electrode (102, 102*g*, 102*s*, 202) such as to be electrically connected to the main surface electrode (102, 102*g*, 102*s*, 202).

[B2] The semiconductor device (100, 100*a*, 100*b*, 100*c*, 200) according to B1, wherein the pad electrode (105, 105*c*, 105*g*, 105*s*, 105*t*, 205) contacts the mold layer (106, 206).

[B3] The semiconductor device (100, 100*a*, 100*b*, 100*c*, 200) according to B1 or B2, wherein the insulating film (104, 204) covers a peripheral edge portion of the main surface electrode (102, 102*g*, 102*s*, 202) such as to expose an inner portion of the main surface electrode (102, 102*g*, 102*s*, 202), the mold layer (106, 206) covers the peripheral edge portion of the main surface electrode (102, 102*g*, 102*s*, 202) across the insulating film (104, 204) such as to expose the inner portion of the main surface electrode (102, 102*g*, 102*s*, 202), and the pad electrode (105, 105*c*, 105*g*, 105*s*, 105*t*, 205) is arranged at the inner portion of the main surface electrode (102, 102*g*, 102*s*, 202).

[B4] The semiconductor device (100, 100*a*, 100*b*, 100*c*, 200) according to B3, wherein the mold layer (106, 206) partially exposes the insulating film (104, 204) at the inner portion side of the main surface electrode (102, 102*g*, 102*s*, 202) and the pad electrode (105, 105*c*, 105*g*, 105*s*, 105*t*, 205) contacts the main surface electrode (102, 102*g*, 102*s*, 202), the insulating film (104, 204), and the mold layer (106, 206) at the inner portion side of the main surface electrode (102, 102*g*, 102*s*, 202).

[B5] The semiconductor device (100, 100*a*, 100*b*, 100*c*, 200) according to any one of B1 to B4, wherein the insulating film (104, 204) covers the main surface (101*a*, 201*a*) at an interval inward from a peripheral edge of the main surface (101*a*, 201*a*) and the mold layer (106, 206) covers a peripheral edge portion of the main surface (101*a*, 201*a*).

[B6] The semiconductor device (100, 100*a*, 100*b*, 100*c*, 200) according to any one of B1 to B5, wherein the mold layer (106, 206) is formed to an annular shape that surrounds an inner portion of the main surface (101*a*, 201*a*) in plan view.

[B7] The semiconductor device (100, 100*a*, 100*b*, 100*c*, 200) according to any one of B1 to B6, wherein the semiconductor layer (101, 201) includes a side surface and the mold layer (106, 206) has a mold side surface that is continuous to the side surface of the semiconductor layer (101, 201).

[B8] The semiconductor device (100, 100*a*, 100*b*, 100*c*, 200) according to B7, wherein the side surface of the semiconductor layer (101, 201) is constituted of a ground surface and the mold side surface of the mold layer (106, 206) is constituted of a ground surface.

[B9] The semiconductor device (100, 100*a*, 100*b*, 100*c*, 200) according to any one of B1 to B8, wherein the mold layer (106, 206) has a mold main surface that extends along the main surface (101*a*, 201*a*).

[B10] The semiconductor device (100, 100*a*, 100*b*, 100*c*, 200) according to B9, wherein the pad electrode (105, 105*c*, 105*g*, 105*s*, 105*t*, 205) has an electrode surface that is continuous to the mold main surface of the mold layer (106, 206).

[B11] The semiconductor device (100, 100*a*, 100*b*, 100*c*, 200) according to B10, wherein the mold main surface of the mold layer (106, 206) is constituted of a ground surface and the electrode surface of the pad electrode (105, 105*c*, 105*g*, 105*s*, 105*t*, 205) is constituted of a ground surface.

[B12] The semiconductor device (100, 100*a*, 100*b*, 100*c*, 200) according to any one of B1 to B11, wherein the mold layer (106, 206) is thicker than the insulating film (104, 204) and the pad electrode (105, 105*c*, 105*g*, 105*s*, 105*t*, 205) is thicker than the insulating film (104, 204).

[B13] The semiconductor device (100, 100*a*, 100*b*, 100*c*, 200) according to any one of B1 to B12, wherein the insulating film (104, 204) includes a photosensitive resin and the mold layer (106, 206) includes a thermosetting resin.

[B14] The semiconductor device (100, 100*a*, 100*b*, 100*c*, 200) according to any one of B1 to B13, wherein the pad electrode (105, 105*c*, 105*g*, 105*s*, 105*t*, 205) includes a plating layer.

[B15] The semiconductor device (100, 100*a*, 100*b*, 100*c*, 200) according to any one of B1 to B14, wherein the semiconductor layer (101, 201) includes a wide bandgap semiconductor.

[B16] The semiconductor device (100, 100*a*, 100*b*, 100*c*, 200) according to any one of B1 to B15, wherein the semiconductor layer (101, 201) includes an SiC.

[B17] A semiconductor device (100, 100*a*, 100*b*, 100*c*, 200) comprising, a semiconductor layer (101, 201) that has a main surface (101*a*, 201*a*), a main surface electrode (102, 102*g*, 102*s*, 202) that is arranged at the main surface (101*a*, 201*a*), a photosensitive resin layer (104, 204) that covers a peripheral edge portion of the main surface electrode (102, 102*g*, 102*s*, 202) such as to expose an inner portion of the main surface electrode (102, 102*g*, 102*s*, 202) a thermosetting resin layer (106, 206) that covers the peripheral edge portion of the main surface electrode (102, 102*g*, 102*s*, 202) across the photosensitive resin layer (104, 204) such as to expose the inner portion of the main surface electrode (102, 102*g*, 102*s*, 202), and a pad electrode (105, 105*c*, 105*g*, 105*s*, 105*t*, 205) that is arranged at the inner portion of the main surface electrode (102, 102*g*, 102*s*, 202).

[B18] The semiconductor device (100, 100*a*, 100*b*, 100*c*, 200) according to B17, wherein the pad electrode (105, 105*c*, 105*g*, 105*s*, 105*t*, 205) is arranged at the main surface electrode (102, 102*g*, 102*s*, 202) such as to contact the thermosetting resin layer (106, 206) and has an electrode surface that is exposed from the thermosetting resin layer (106, 206).

[B19] The semiconductor device (100, 100*a*, 100*b*, 100*c*, 200) according to B17 or B18, wherein the thermosetting resin layer (106, 206) partially exposes the photosensitive resin layer (104, 204) at the inner portion side of the main surface electrode (102, 102*g*, 102*s*, 202) and the pad electrode (105, 105*c*, 105*g*, 105*s*, 105*t*, 205) contacts the main surface electrode (102, 102*g*, 102*s*, 202), the photosensitive resin layer (104, 204), and the thermosetting resin layer (106, 206) at the inner portion side of the main surface electrode (102, 102*g*, 102*s*, 202).

[B20] The semiconductor device (100, 100*a*, 100*b*, 100*c*, 200) according to any one of B17 to B19, wherein the semiconductor layer (101, 201) includes an SiC.

REFERENCE SIGNS LIST

100 semiconductor device
100*a* semiconductor device
100*b* semiconductor device
100*c* semiconductor device
101 semiconductor layer
101*a* first main surface (main surface)
102 first electrode layer (main surface electrode)
102*g* first electrode layer (main surface electrode)
102*s* first electrode layer (main surface electrode)
104 insulating film (photosensitive resin layer)
105 plating layer (pad electrode)
105*c* current sensing pad (pad electrode)
105*g* gate pad (pad electrode)
105*s* source pad (pad electrode)
105*t* temperature sensing pad (pad electrode)
106 mold layer (thermosetting resin layer)
200 semiconductor device
201 semiconductor layer
201*a* first main surface (main surface)
202 first electrode layer (main surface electrode)
204 insulating film (photosensitive resin layer)
205 plating layer (pad electrode)
206 mold layer (thermosetting resin layer)

The invention claimed is:

1. A semiconductor device comprising:

a semiconductor layer that has a main surface and a side surface;

a main surface electrode that is arranged at the main surface and has a peripheral edge positioned on a side of the side surface of the semiconductor layer;

an insulating film that partially covers the main surface electrode such as to expose a portion of the main surface electrode and has a peripheral edge positioned on the side of the side surface of the semiconductor layer;

a resin layer that covers the insulating film such as to expose the main surface electrode and has a resin side surface positioned on the side of the side surface of the semiconductor layer and a resin main surface extending along the main surface; and a pad electrode that is arranged on the main surface electrode such as to be electrically connected to the main surface electrode and has an electrode surface exposed from the resin main surface of the resin layer, wherein the peripheral edge of the main surface electrode, the peripheral edge of the insulating film, and the resin side surface of the resin layer are positioned in that order toward the side surface of the semiconductor layer, the resin side surface of the resin layer is formed flush with the side surface of the semiconductor layer, and the resin main surface of the resin layer is formed flush with the electrode surface of the pad electrode and constitutes an outer surface of the semiconductor device.

2. The semiconductor device according to claim 1, wherein the pad electrode contacts the resin layer.

3. The semiconductor device according to claim 1, wherein the insulating film covers a peripheral edge portion of the main surface electrode such as to expose an inner portion of the main surface electrode, the resin layer covers the peripheral edge portion of the main surface electrode across the insulating film such as to expose the inner portion of the main surface electrode, and the pad electrode is arranged on the inner portion of the main surface electrode.

4. The semiconductor device according to claim 3, wherein the resin layer partially exposes the insulating film at the inner portion of the main surface electrode, and the pad electrode contacts the main surface electrode, the insulating film, and the resin layer at the inner portion of the main surface electrode.

5. The semiconductor device according to claim 1, wherein the insulating film covers the main surface at an interval inward from the side surface of the main surface, and the resin layer covers a peripheral edge portion of the main surface.

6. The semiconductor device according to claim 1, wherein the resin layer is formed to be an annular shape that surrounds an inner portion of the main surface in plan view.

7. The semiconductor device according to claim 1, wherein the side surface of the semiconductor layer is constituted of a ground surface, and the resin side surface of the resin layer is constituted of a ground surface.

8. The semiconductor device according to claim 1, wherein the resin main surface of the resin layer is constituted of a ground surface, and the electrode surface of the pad electrode is constituted of a ground surface.

9. The semiconductor device according to claim 1, wherein the resin layer is thicker than the insulating film, and the pad electrode is thicker than the insulating film.

10. The semiconductor device according to claim 1, wherein the insulating film includes a photosensitive resin, and the resin layer includes a thermosetting resin.

11. The semiconductor device according to claim 1, wherein the pad electrode includes a plating layer.

12. The semiconductor device according to claim 1, wherein the semiconductor layer includes a wide bandgap semiconductor.

13. The semiconductor device according to claim 1, wherein the semiconductor layer comprises SiC.

14. A semiconductor device comprising:

a semiconductor layer that has a main surface and a side surface;

a main surface electrode that is arranged at the main surface and has a peripheral edge positioned on a side of the side surface of the semiconductor layer;

a photosensitive resin layer that covers a peripheral edge portion of the main surface electrode such as to expose an inner portion of the main surface electrode and has a peripheral edge positioned on a side of the side surface of the semiconductor layer;

a thermosetting resin layer that covers the peripheral edge portion of the main surface electrode across the photosensitive resin layer such as to expose the inner portion of the main surface electrode, and has a resin side surface positioned on the side of the side surface of the semiconductor layer and a resin main surface extending along the main surface; and a pad electrode that is arranged on the inner portion of the main surface electrode and has an electrode surface exposed by the resin main surface of the thermosetting resin layer, wherein the peripheral edge of the main surface electrode, the peripheral edge of the photosensitive resin layer, and the resin side surface of the thermosetting resin layer are positioned in that order toward the side surface of the semiconductor layer, the resin side surface of the thermosetting resin layer is formed flush with the side surface of the semiconductor layer, and the resin main surface of the thermosetting resin layer is formed flush with the electrode surface of the pad electrode and constitutes an outer surface of the semiconductor device.

15. The semiconductor device according to claim 14, wherein the pad electrode is arranged at the main surface electrode such as to contact the thermosetting resin layer, and the electrode surface of the pad electrode is exposed from the thermosetting resin layer.

16. The semiconductor device according to claim 14, wherein the thermosetting resin layer partially exposes the photosensitive resin layer at the inner portion of the main surface electrode, and the pad electrode contacts the main surface electrode, the photosensitive resin layer, and the thermosetting resin layer at the inner portion of the main surface electrode.

17. The semiconductor device according to claim 14, wherein the semiconductor layer comprises SiC.

* * * * *